(12) United States Patent
Tsou et al.

(10) Patent No.: US 11,177,430 B2
(45) Date of Patent: Nov. 16, 2021

(54) MEMORY DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Ya-Jui Tsou, Taichung (TW); Zong-You Luo, Taoyuan (TW); Chee-Wee Liu, Taipei (TW); Shao-Yu Lin, Taichung (TW); Liang-Chor Chung, Hsinchu County (TW); Chih-Lin Wang, Hsinchu County (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/443,772

(22) Filed: Jun. 17, 2019

(65) Prior Publication Data
US 2020/0395530 A1    Dec. 17, 2020

(51) Int. Cl.
| H01L 43/02 | (2006.01) |
| H01L 27/22 | (2006.01) |
| H01L 43/12 | (2006.01) |
| G11C 11/16 | (2006.01) |

(52) U.S. Cl.
CPC ............ *H01L 43/02* (2013.01); *G11C 11/161* (2013.01); *H01L 27/222* (2013.01); *H01L 43/12* (2013.01)

(58) Field of Classification Search
None
See application file for complete search history.

(56) References Cited

U.S. PATENT DOCUMENTS

| 2014/0103469 | A1* | 4/2014 | Jan ........................ H01F 41/307 |
| | | | 257/421 |
| 2016/0005958 | A1* | 1/2016 | Seino ....................... H01L 43/12 |
| | | | 438/3 |
| 2018/0040807 | A1* | 2/2018 | Saito .................... G11C 11/1659 |
| 2019/0079701 | A1* | 3/2019 | Rakshit ................. G06F 3/0616 |
| 2020/0006626 | A1* | 1/2020 | Smith ..................... H01L 43/08 |
| 2020/0006637 | A1* | 1/2020 | Gosavi .................... H01L 43/02 |
| 2020/0082858 | A1* | 3/2020 | Kim .................... G11C 11/1673 |

OTHER PUBLICATIONS

J. Swerts1, et al. "Top pinned magnetic tunnel junction stacks with high annealing tolerance for high density STT-MRAM applications.", IEEE International Magnetics Conference, (2017).
K. Garello et. al. "SOT-MRAM 300mm integration for low power and ultrafast embedded memories", Symposium on VLSI Circuits Digest of Technical Papers,(2018) 81-82.

* cited by examiner

Primary Examiner — Benjamin P Sandvik
(74) Attorney, Agent, or Firm — Maschoff Brennan

(57) ABSTRACT

A magnetoresistive memory device includes a memory stack, a spin-orbit-torque (SOT) layer, and a free layer. The memory stack includes a pinned layer and a reference layer over the pinned layer. The SOT layer is spaced apart from the memory stack. The free layer is over the memory stack and the SOT layer.

20 Claims, 36 Drawing Sheets

MEMORY DEVICE AND MANUFACTURING METHOD THEREOF

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

One type of feature that may be part of an integrated circuit is a Magnetic Tunnel Junction (MTJ). An MTJ is a device that changes its resistive state based on the state of magnetic materials within the device. The MTJ involves spin electronics, which combines semiconductor technology and magnetic materials and devices. The spin polarization of electrons, rather than the charge of the electrons, is used to indicate the state of "1" or "0."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
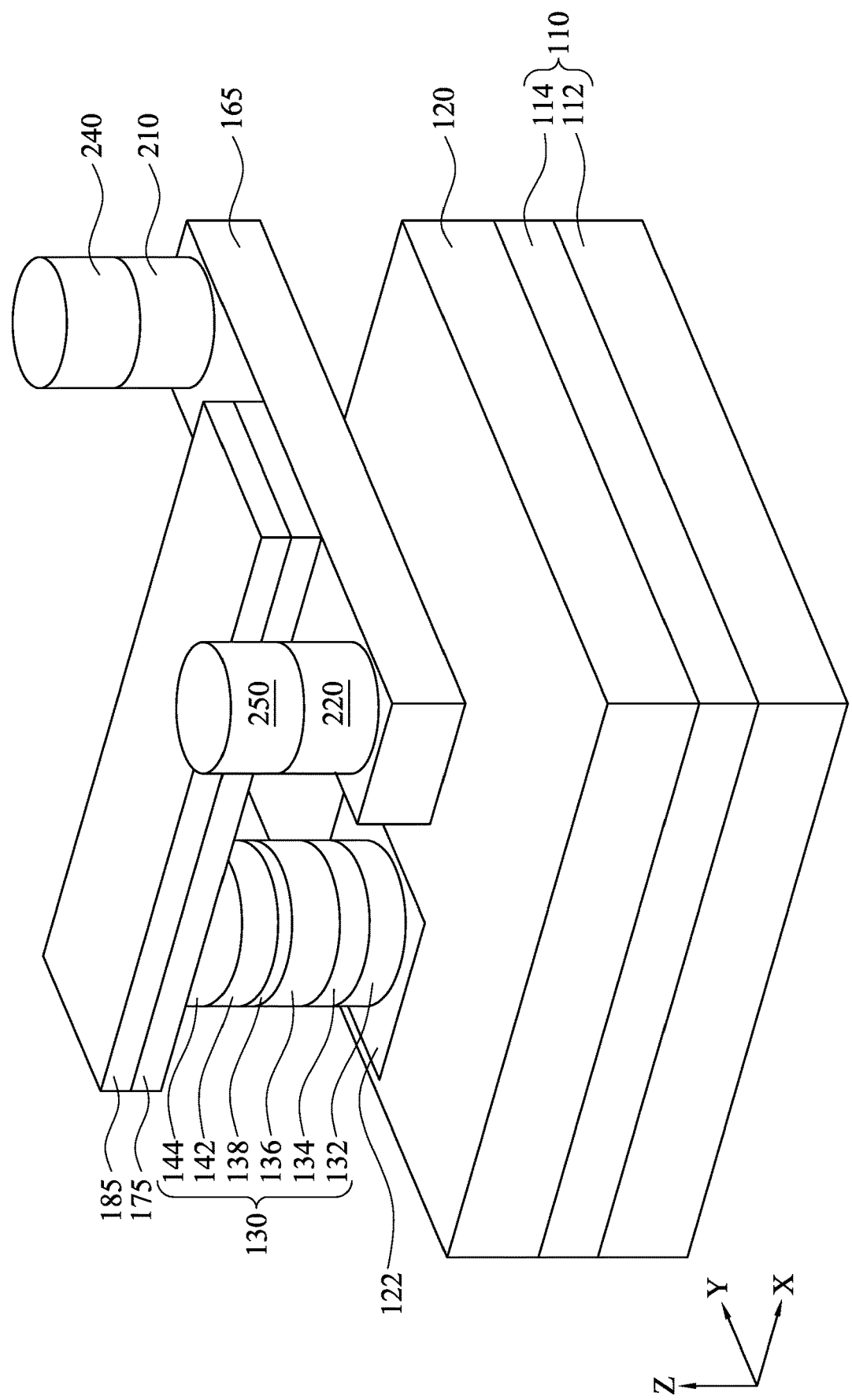
FIG. 1 is a perspective view of a memory device over a wafer in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The embodiments of this disclosure relate to integrated memory fabrications and more specifically to spin-orbit torque (SOT) magnetoresistive memory formations by forming a folded SOT magnetoresistive memory. Because of the folded SOT magnetoresistive memory, an integrated memory device with improved thermal stability and perpendicular magnetic anisotropy (PMA) can be formed.

FIG. 1 is a perspective view of a memory device in accordance with various embodiments of the present disclosure. The memory device includes a memory stack 130, a spin-orbit torque (SOT) layer 165, a free layer 175, and a capping layer 185. The free layer 175 is over the memory stack 130 and the SOT layer 165, and the capping layer 185 is over the free layer 175. The free layer 175 and the memory stack 130 may be together referred to as a magnetic tunnel junction (MTJ). The free layer 175 and the SOT layer 165 extend toward different directions. For example, the free layer 175 extends in an X direction, and the SOT layer 165 extends in a Y direction. Since the free layer 175 is over the memory stack 130 and the SOT layer 165, the memory device is considered as a folded SOT magnetoresistive memory device. In FIG. 1, the memory stack 130, the spin-orbit torque (SOT) layer 165, the free layer 175 may be referred to as a memory cell, and the memory device may include a plurality of memory cells over the wafer 110.

The memory stack 130 includes a first electrode 132, a seed layer 134, a pinned layer 136, a spacer layer 138, a reference layer 142, and a tunnel barrier layer 144. The seed layer 134 is over the first electrode 132, the pinned layer 136 is over the seed layer 134, the spacer layer 138 is over the pinned layer 136, the reference layer 142 is over the spacer layer 138, and the tunnel barrier layer 144 is over the reference layer 142. The tunnel barrier layer 144 is in contact with the free layer 175, and the perpendicular magnetic anisotropy (PMA) can be formed at the interface of the tunnel barrier layer 144 and the free layer 175. The memory device may further include a second electrode 210 and a third electrode 220 over the SOT layer 165 and on opposite ends thereof. Also, the second electrode 210 and the third electrode 220 are on opposite sides of the free layer 175 (and/or the capping layer 185). In some embodiments, a first top via may be formed over the second electrode 210 and a second top via may be formed over the third electrode 220 to interconnect the second electrode 210/third electrode 220 and other conductive elements (e.g., the bit line BL in FIG. 18).

In FIG. 1, the pinned layer 136 is a layer for providing fixed magnetization. Specifically, the magnetization of the pinned layer 136 maintains a fixed orientation perpendicular to the plane via strong perpendicular magnetic anisotropy (PMA). Since the pinned layer 136 is in contact with the seed layer 134, which may be made of metal, the thermal stability of the pinned layer 136 (and the memory stack 130) is improved. For example, one or more conductive lines/vias (such as the bit line BL in FIG. 18) may be formed over the memory device. The conductive lines/vias formations may be associated with thermal processes (e.g., about 400° C. annealing process). The tunnel magnetoresistance (TMR), which is a magnetoresistive effect that occurs in a MTJ, of the pinned layer 136 may suffers degradation during the thermal process if the pinned layer 136 has no seed layer below. In FIG. 1, the seed layer 134 provides a good texture for the pinned layer 136 to improve the crystallinity, such that the memory device in FIG. 1 has good thermal stability and has high TMR.

Furthermore, besides the PMA formed at the interface of the free layer 175 and the memory stack 130 (or the tunnel barrier layer 144), PMA also formed at the interface of the free layer 175 and the capping layer 185. Since the contact area between the free layer 175 and the capping layer 185 is large, the PMA of the free layer 175 is sufficiently increased. The high PMA improves/increases the thermal stability factor of the memory device. The high thermal stability factor results in the large retention.

The write current may be applied to the SOT layer 165 in the direction from the second electrode 210 toward the third electrode 220, and the read current may be applied to the free layer 175 in the direction from the first electrode 132 toward one of the second electrode 210 and the third electrode 220. When the write current is applied to the SOT layer 165 in the direction from the second electrode 210 toward the third electrode 220, a write electron current flows in the SOT layer 165 from the second electrode 210 toward the third electrode 220. According to spin Hall effect, up and down spins get deflected towards different surfaces in the transverse direction as they move along the longitudinal direction. In the SOT layer 165, because of the spin Hall effect, excessive spins will accumulate at the surface when the write current is applied. Therefore, a spin current from the lower surface toward the upper surface or from the upper surface toward the lower surface of the SOT layer 165 flows in the portion of the SOT layer 165 located under the free layer 175. This spin current applies a spin torque to the magnetization of the free layer 175 so that the magnetization direction of the free layer 175 is aligned with the spin direction (X or −X direction). The magnetization of the free layer 175 may be switched from +X to −X direction toward −Z direction by natural damping after the write current is turned off. Although the spin direction is an in-plane direction (a direction perpendicular to the direction of stacking in the memory stack 130, or −X direction) in FIG. 1, the spin direction may be a direction perpendicular to the plane (the direction of stacking in the memory stack 130). Also, the easy axis of the free layer 175, the reference layer 142, and/or the pinned layer 136 may be in-plane or perpendicular.

In some embodiments, the memory device is formed over a wafer 110 including a substrate 112 and a logic circuit 114 over the substrate 112. The logic circuit 114 may include CMOS back-end-of-line (BEOL) structures, and the present disclosure is not limited in this respect. The memory device further includes dielectric layers over the wafer 110 and surrounding the memory device, and they are not shown in FIG. 1 for clarity.

Figure 2A:
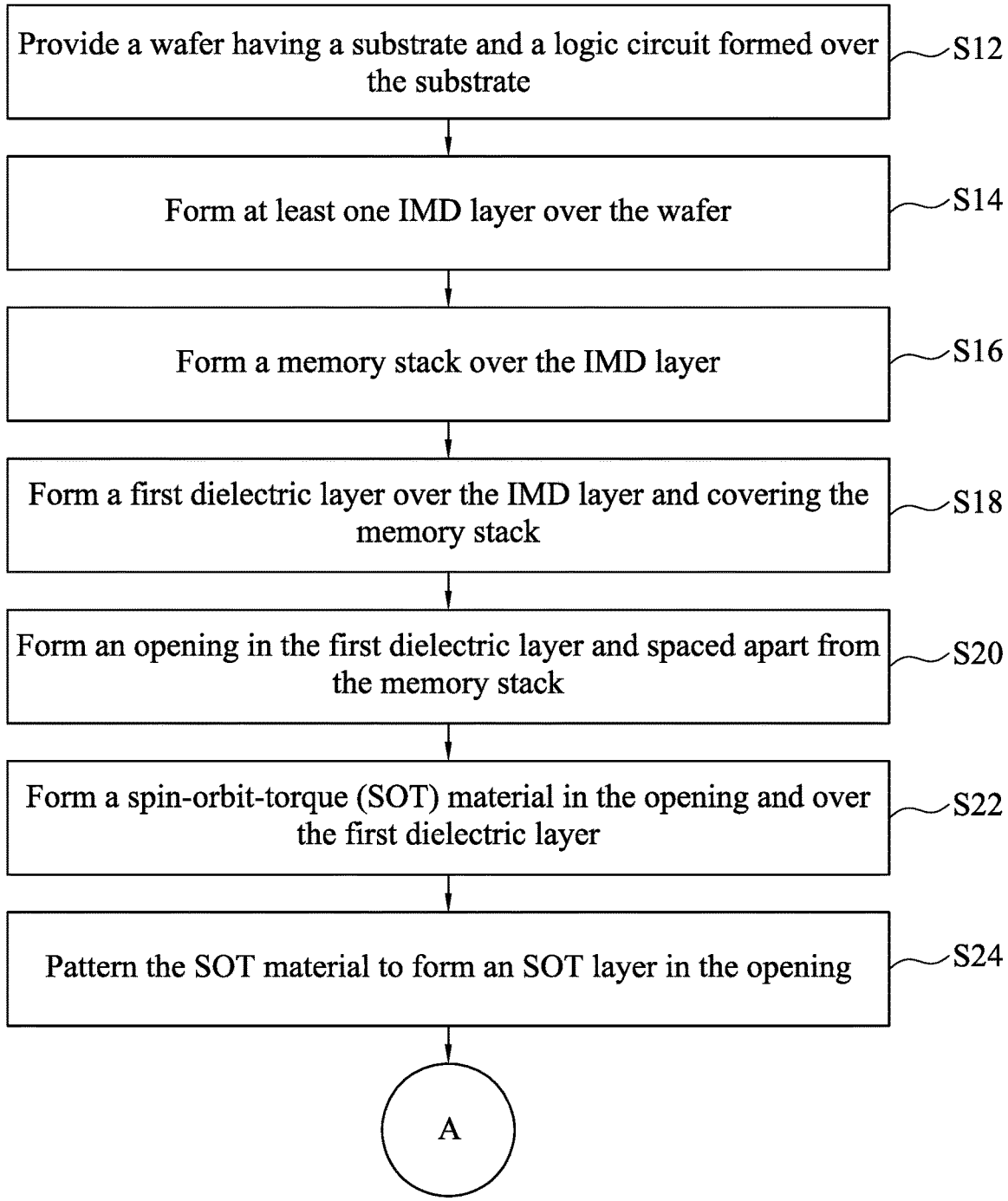
FIGS. 2A and 2B are a flowchart of a method for making a memory device according to aspects of the present disclosure in various embodiments.
Figure 2B:
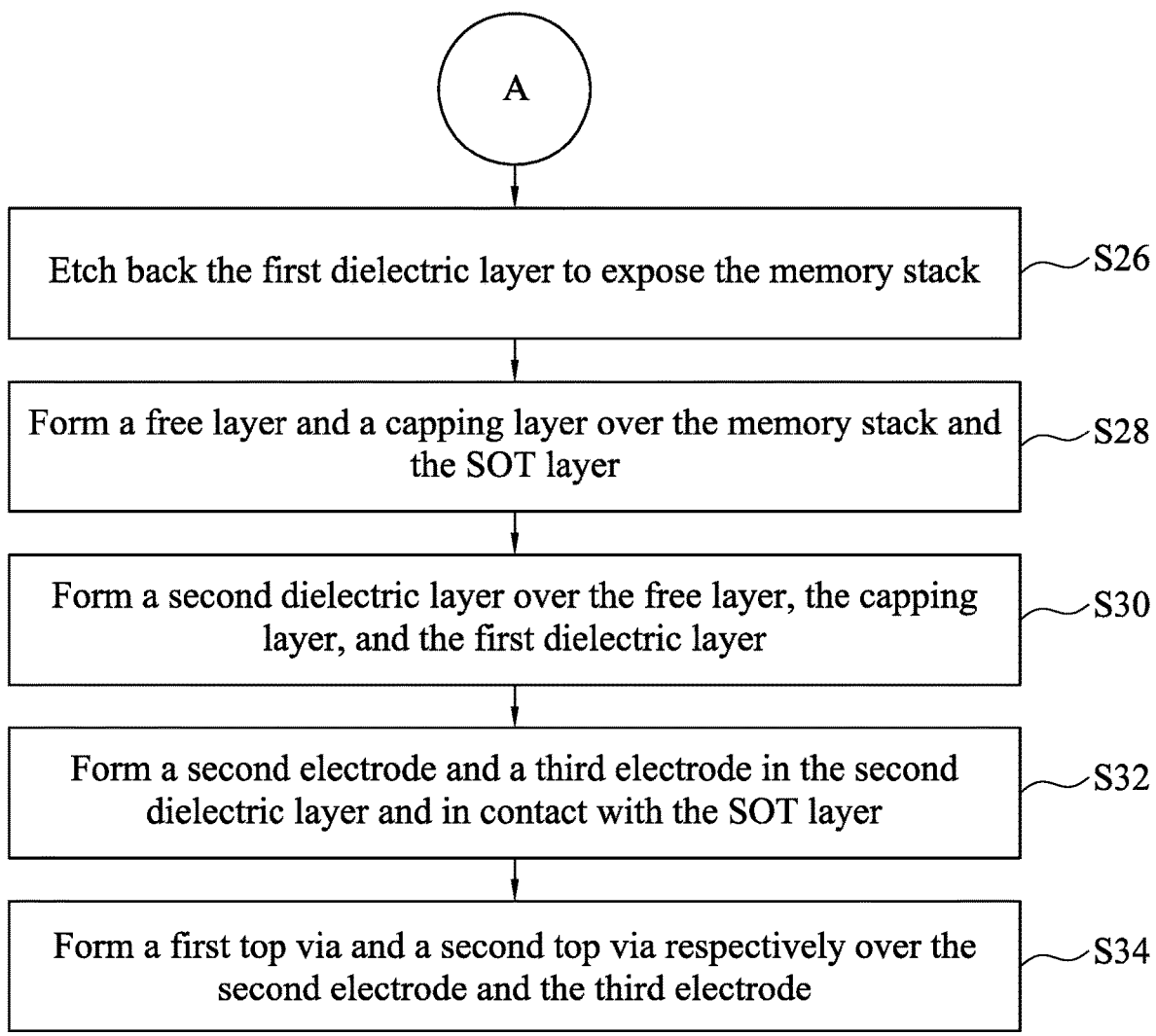

FIGS. 2A and 2B are a flowchart of a method M10 for making a memory device according to aspects of the present disclosure in various embodiments. Various operations of the method M10 are discussed in association with cross-section diagrams FIGS. 3A-16C, where FIGS. 3A, 4A, 5A, 6A, 7A, 8A, 9A, 10A, 11A, 12A, 13A, 14A, 15A, and 16A respectively illustrate top views of the semiconductor device illustrated in FIG. 1 at various stages in accordance with some embodiments of the present disclosure, FIGS. 3B, 4B, 5B, 6B, 7B, 8B, 9B, 10B, 11B, 12B, 13B, 14B, 15B, and 16B illustrate cross-sectional views of lines B-B respectively illustrated in FIGS. 3A, 4A, 5A, 6A, 7A, 8A, 9A, 10A, 11A, 12A, 13A, 14A, 15A, and 16A, and FIGS. 14C, 15C, and 16C illustrate cross-sectional views of lines C-C respectively illustrated in FIGS. 14A, 15A, and 16A. Throughout the various views and illustrative embodiments, like reference numbers are used to designate like elements.

Figure 3A:
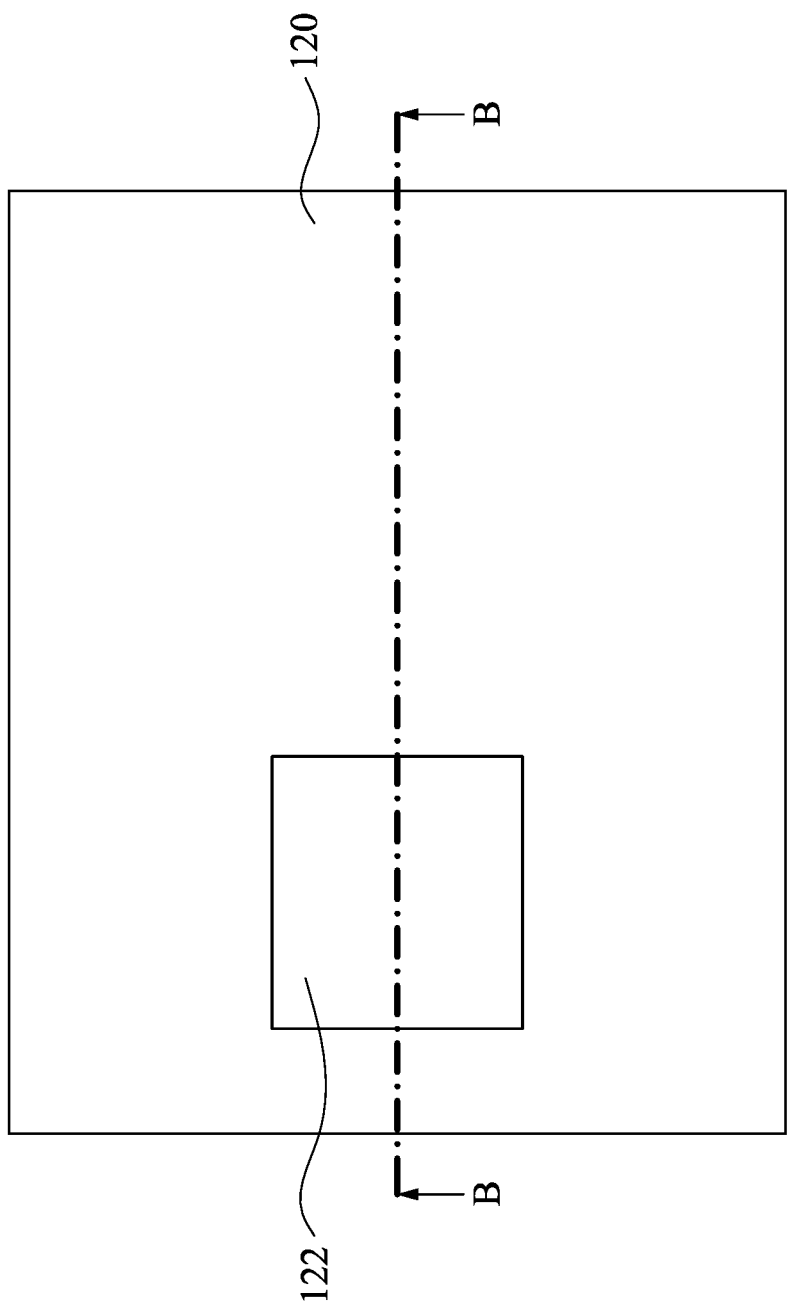
FIGS. 3A, 4A, 5A, 6A, 7A, 8A, 9A, 10A, 11A, 12A, 13A, 14A, 15A, and 16A respectively illustrate top views of the semiconductor device illustrated in FIG. 1 at various stages in accordance with some embodiments of the present disclosure.
Figure 3B:
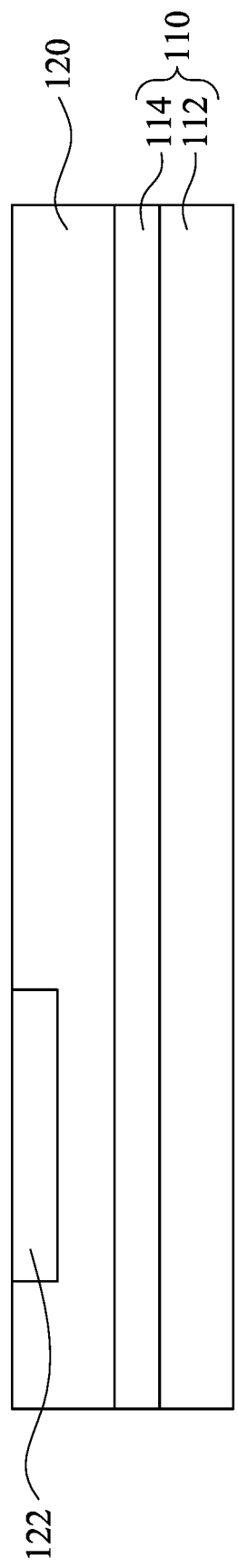
FIGS. 3B, 4B, 5B, 6B, 7B, 8B, 9B, 10B, 11B, 12B, 13B, 14B, 15B, and 16B illustrate cross-sectional views of lines B-B respectively illustrated in FIGS. 3A, 4A, 5A, 6A, 7A, 8A, 9A, 10A, 11A, 12A, 13A, 14A, 15A, and 16A.

In operation S12 of method M10, a wafer 110 having a substrate 112 and a logic circuit 114 formed over the substrate 112 is provided, as shown in FIGS. 3A and 3B. The substrate 112 may be a silicon substrate. Alternatively, the substrate 112 may include another elementary semiconductor, such as germanium; a compound semiconductor including silicon carbide; an alloy semiconductor including silicon germanium; or combinations thereof. In some embodiments, the substrate 112 is a semiconductor on insulator (SOI) substrate. The substrate 112 may include doped regions, such as p-wells and n-wells. In some embodiments, the wafer 110 is a workpiece that includes the substrate 112 and various features formed in and over and attached to the substrate 112. In some embodiments, the logic circuit 114 includes transistors formed by transistor fabrication processes and may be a planar transistor, such as polysilicon gate transistors or high-k metal gate transistors, or a multi-gate transistor, such as fin field effect transistors.

In operation S14 of method M10 in FIG. 2A, at least one IMD layer 120 is formed over the wafer 110, as shown in FIGS. 3A and 3B. The IMD layer 120 may provide electrical interconnection between the memory cells and the logic circuit 114 as well as structural support for the various features of the memory device during many fabrication process operations, some of which will be discussed herein. For example, the IMD layer 120 can act as structural support for memory cells formed thereon. Specifically, the memory cell is formed over the IMD layer 120 as shown in FIG. 1. In some embodiments, the IMD layer 120 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 120 is a low-k dielectric layer made from extra low-k materials, extreme low-k materials, combinations thereof, or the like. In some embodiments, the IMD layer 120 may have a dielectric constant lower than 2.4. In some embodiments, the IMD layer 120 is made using diethoxymethylsilane (mDEOS) or the like as a precursor gas in a chemical vapor deposition (CVD) process. However, other low-k dielectric materials may be used as well. The IMD layer 120 also includes conductive elements (such as the conductive element 122) for interconnecting the memory cells and the logic circuit 114. In some embodiments, the conductive element 122 is formed of copper or copper alloys. In some other embodiments, the conductive element 122 may be formed of conductive materials such as aluminum, tungsten, carbon, cobalt, TaN, or other suitable materials. In still some other embodiments, the conductive element 122 may be a bilayer structure (e.g., a TaN layer and a TiN layer formed on the TaN layer). In some embodiments, both of the conductive element 122 and the topmost dielectric layer of the IMD layer 120 have a thickness in a range from about 1 nm to about 1000 nm.

Figure 4A:
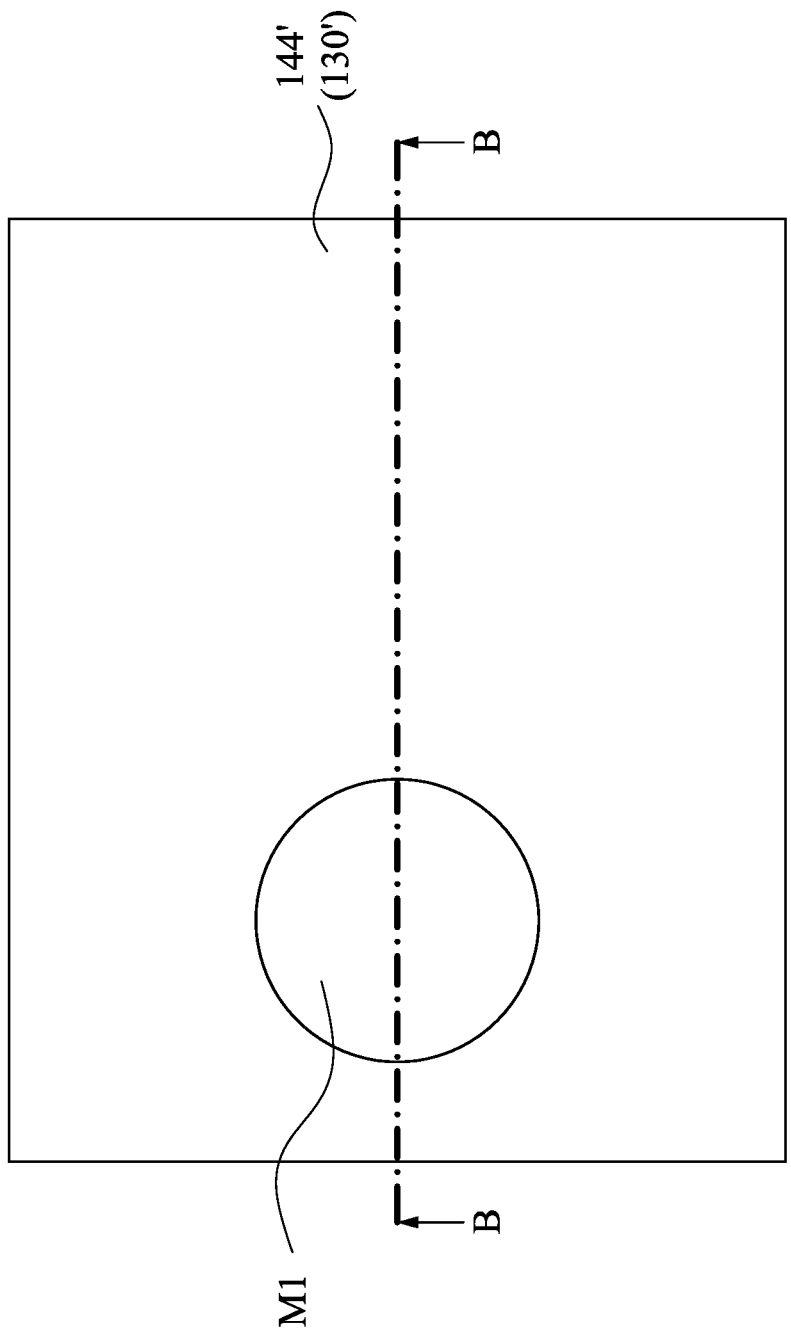
Figure 4B:
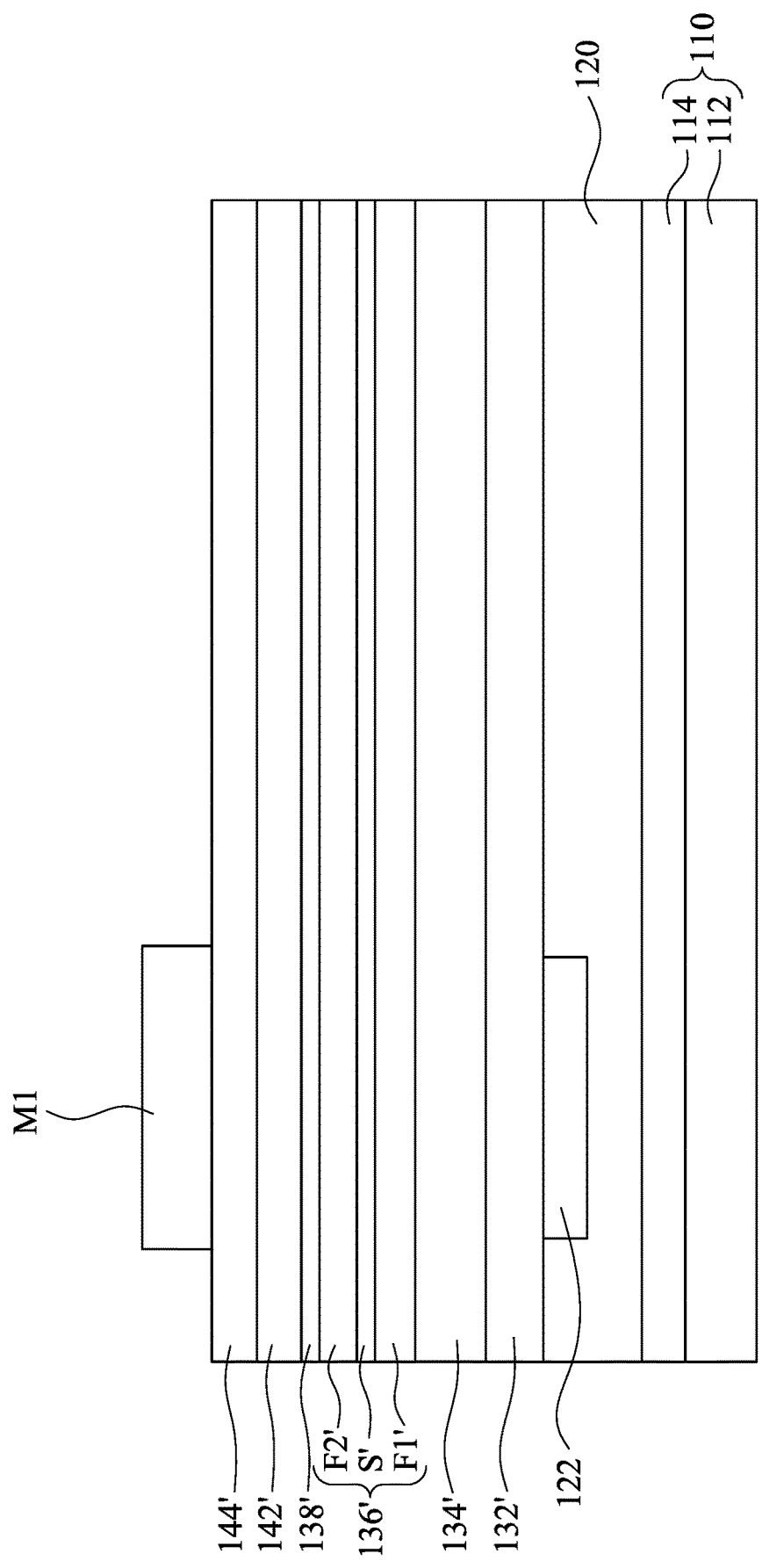

In operation S16 of method M10 in FIG. 2A, a memory stack 130 is formed over the IMD layer 120, as shown in FIGS. 4A, 4B, 5A and 5B. Reference is made to FIGS. 4A and 4B. A conductive layer 132' is formed on the IMD layer 120. The conductive layer 132' may be made of a variety of conductive materials such as metal or metal alloy materials. For example, the conductive layer 132' may be made of ruthenium (Ru), copper (Cu), tungsten (W), aluminum (Al), titanium (Ti), tantalum (Ta), TiN, or other suitable conductive material(s) or layered combination thereof. The conductive layer 132' may be deposited by a suitable technique, such as physical vapor deposition (PVD), plating or a procedure that includes forming a seed layer by PVD and then plating to form the conductive layer on the seed layer. In some embodiments, the conductive layer 132' has a thickness in a range from about 1 nm to about 1000 nm.

A seed layer 134' is then formed on the conductive layer 132'. The seed layer 134' may be made of a variety of conductive materials such as metal or metal alloy materials. For example, the seed layer 134' may be made of platinum (Pt), ruthenium (Ru), copper (Cu), tungsten (W), aluminum (Al), titanium (Ti), tantalum (Ta), or other suitable conductive material(s) or layered combination thereof. The seed layer 134' may be deposited by a suitable technique, such as physical vapor deposition (PVD), plating, or other suitable processes. In some embodiments, the seed layer 134' has a thickness in a range from about 0.1 nm to about 100 nm.

A pinned layer 136' is then formed on the seed layer 134'. A purpose of the pinned layer 136' (also called as a synthetic anti-ferromagnetic (SAF) layer) is to fix, or pin, the magnetization direction of the reference layer 142' through anti-ferromagnetic coupling. The pinned layer 136' includes a bottom pinned layer F1', a top pinned layer F2', and a spacer film S' between the bottom pinned layer F1' and the top pinned layer F2'. The bottom pinned layer F1' and the top pinned layer F2' are both multilayers. Specifically, the bottom pinned layer F1' includes two or more ferromagnetic films. Particularly, the bottom pinned layer F1' includes a first film of a ferromagnetic material and a second film of a non-magnetic material alternatively arranged. In some embodiments, there are N layers of first film and N layers of second film, and N is 1 to about 100. In some examples, the materials of the first film and the second film in the bottom pinned layer F1' include Co, Pt, Ni, Fe, or other suitable materials. For example, the ferromagnetic material of the first film may be Co and the non-magnetic material of the second film may be Pt. The bottom pinned layer F1' may have a thickness in a range from about 0.1 nm to about 100 nm.

Further, the top pinned layer F2' includes two or more ferromagnetic films. Particularly, the top pinned layer F2' includes a third film of a ferromagnetic material and a fourth film of a non-magnetic material alternatively arranged. In some embodiments, there are M layers of third film and M layers of fourth film, and M is 1 to about 100. In some embodiments, N is greater than M. In some examples, the materials of the third and fourth films in the top pinned layer F2' include Co, Pt, Ni, Fe, or other suitable materials. For example, the ferromagnetic material of the third film may be Co and the non-magnetic material of the fourth film may be Pt. The top pinned layer F2' may have a thickness in a range from about 0.1 nm to about 100 nm.

The spacer film S' is disposed between the bottom pinned layer F1' and the top pinned layer F2'. In some embodiments, the spacer film S' includes ruthenium (Ru). Alternatively, the spacer film S' may include other suitable material, such as Ir, Ti, Ta, Cu, or Ag. In some examples, the spacer film S' may have a thickness in a range from about 0.1 nm to about 10 nm. The spacer film S' may be formed by a PVD process, or another suitable process.

A spacer layer 138' is formed on the pinned layer 136'. The spacer layer 138' may be made of a variety of conductive materials such as metal or metal alloy materials. For example, the spacer layer 138' may be made of Molybdenum (Mo), tungsten (W), tantalum (Ta), or other suitable conductive material(s) or layered combination thereof. The spacer layer 138' may be deposited by a suitable technique, such as physical vapor deposition (PVD), plating, or other suitable processes. In some embodiments, the spacer layer 138' has a thickness in a range from about 0.1 nm to about 1 nm. If the thickness of the spacer layer 138' is greater than about 1 nm, the coupling between the pinned layer 136' and the reference layer 142' formed thereon may be weak. In some embodiments, the seed layer 134' is thicker than the spacer layer 138'.

A reference layer 142' is formed on the spacer layer 138'. The reference layer 142' is a (single) ferromagnetic layer. The reference layer 142' may include Co, Fe, Ni, Mn, B, and/or their alloys, including for example, NiFe, NiFe, CoFe, CoFeB, or compounds thereof, including other ferromagnetic materials. The reference layer 142' may be formed by conventional processes such as, chemical vapor deposition (CVD), physical vapor deposition (PVD), electro-chemical deposition, molecular manipulation, and/or other processes. The reference layer 142' is illustrated in FIG. 4B as a single layer; however, the reference layer 142' may be synthetic. In some embodiments, the reference layer 142' has a thickness in a range from about 0.1 nm to about 100 nm.

A tunnel barrier layer 144' is formed on the reference layer 142. The tunnel barrier layer 144' is thin enough to allow the tunneling of electrons through it. The tunnel barrier layer 144' has a nonmagnetic composition and can be formed from any suitable material that may function as an electrical insulator. Alternatively, the tunnel barrier layer 144' may have the spin filtering to increase the TMR. In some embodiments, the tunnel barrier layer 144' includes aluminium oxide (AlOx). In some alternative embodiments, the tunnel barrier layer 144' includes MgO. Examples of other dielectric materials that may be included in the tunnel barrier layer 144' include oxides or nitrides of Al, Mg, Si, Hf, Sr, or Ti such as, SiOx, SiNx, SiOxNy, AlOx, TOx, TiOx, AlNx, and/or combinations thereof. The tunnel barrier layer 144' may be formed by processes such as, chemical vapor deposition (CVD), plasma enhanced chemical vapor deposition (PECVD), physical vapor deposition (PVD), electro-chemical deposition, molecular manipulation, oxidation, and/or other suitable processes. In some embodiments, the tunnel barrier layer 144' has a thickness in a range from about 0.1 nm to about 10 nm. The tunnel barrier layer 144' may electrically insulate the reference layer 142' from the free layer 175 (see FIG. 1) independently, or in conjunction with other layers interposing the reference layer 142' and the free layer 175. In some embodiments, at least one layer of the tunnel barrier layer 144', the reference layer 142', the spacer layer 138', the pinned layer 136', the seed layer 134', and the conductive layer 132' may be formed by using other process, such as epitaxy process.

Then, a patterned mask layer M1 is formed over the tunnel barrier layer 144'. In some embodiments, a mask material may be formed over the tunnel barrier layer 144' by using spin-coating or other suitable techniques, and the mask material is patterned to be the patterned mask layer M1. In some embodiments, the patterned mask layer M1 may be a photoresist, a hard mask layer, a $SiN_x$ layer, or combinations thereof. A top view of the patterned mask layer M1 may have a suitable shape, such as circular, elliptical, rectangular, square, or some other shapes with or without rounded corners.

Figure 5A:
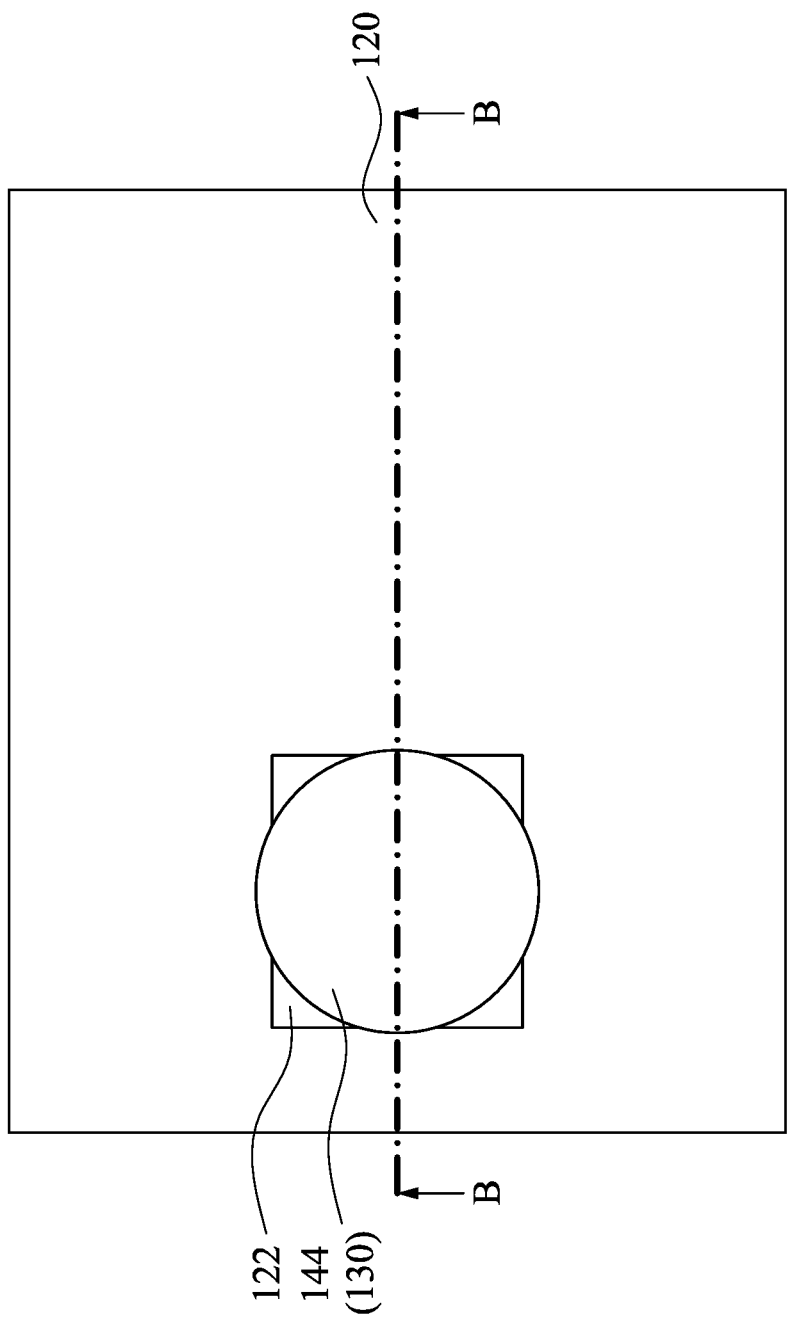
Figure 5B:
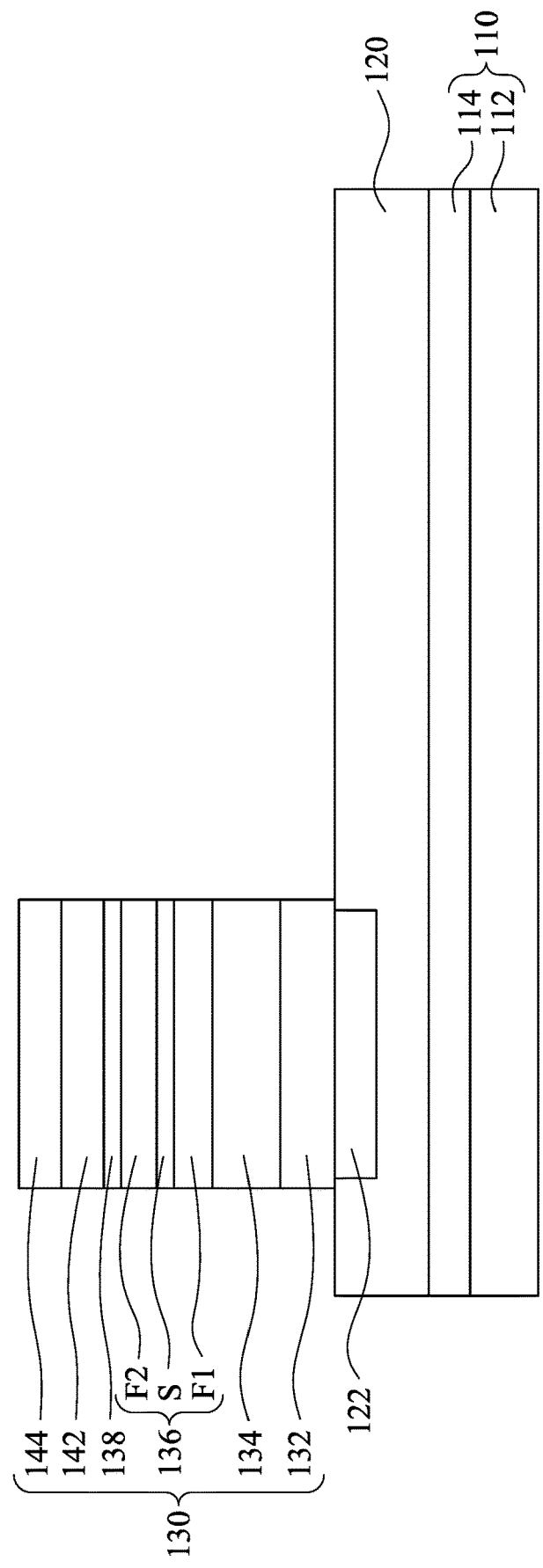

Reference is made to FIGS. 5A and 5B. The tunnel barrier layer 144', the reference layer 142', the spacer layer 138', the pinned layer 136', the seed layer 134', and the conductive layer 132' are patterned to form the memory stack 130 using the patterned mask layer M1 (see FIGS. 4A and 4B) as a mask. As such, the top view of the memory stack 130 has substantially the same shape as the patterned mask layer M1, and may be circular, elliptical, rectangular, square, or some other shapes with or without rounded corners. The memory stack 130 includes a first electrode 132, a seed layer 134, a pinned layer 136, a spacer layer 138, a reference layer 142, and a tunnel barrier layer 144, and the pinned layer 136 includes a bottom pinned layer F1, a top pinned layer F2, and a spacer film S between the bottom pinned layer F1 and a top pinned layer F2. The patterning process in FIGS. 5A and 5B may be performed by using an etching process, such as reactive ion etching (RIE), ion beam etching (IBE), wet etching, or combinations thereof. In some embodiments, the etching gas for the memory stack 130 may include Ar, $CH_3OH$, CO, $NH_3$, $O_2$, $H_2$, halogen gases, or other suitable gases. After the patterning process, the patterned mask layer M1 is removed by using stripping, ashing, or etching process (such as reactive ion etching (RIE), ion beam etching (IBE), wet etching, or combinations thereof).

Figure 6A:
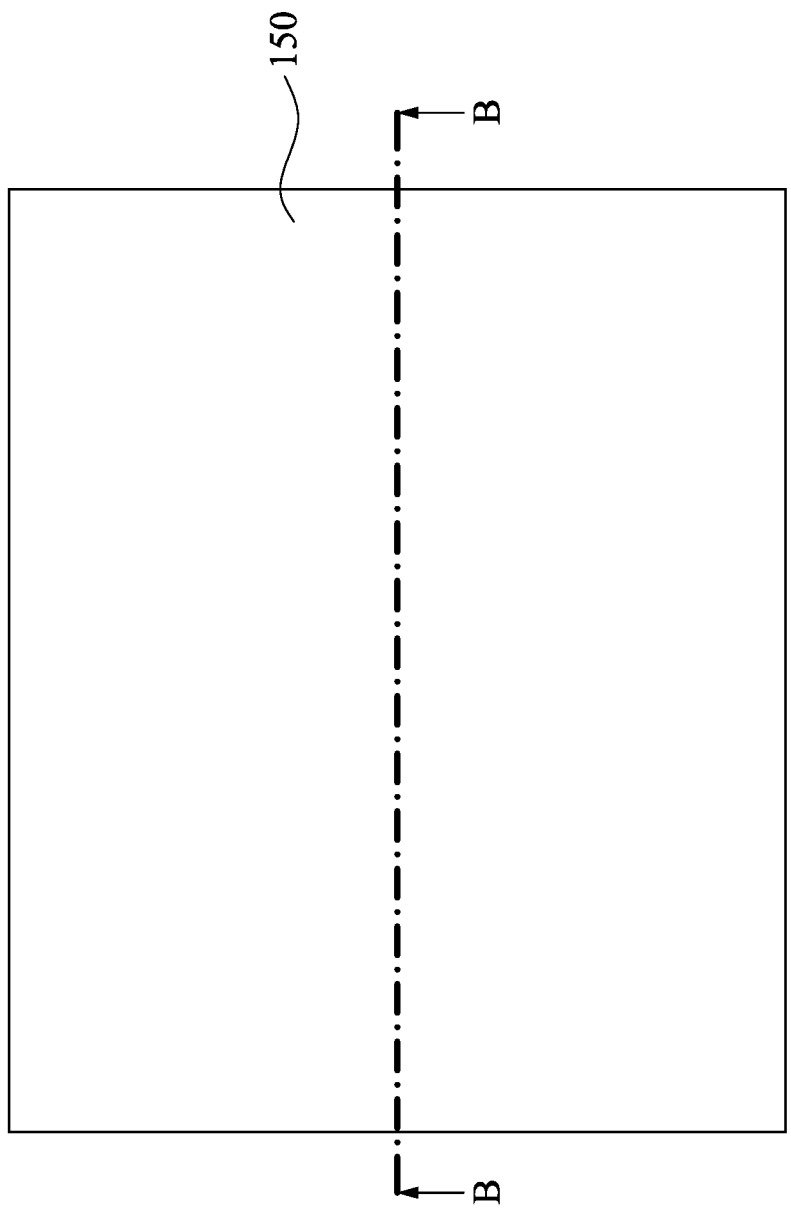
Figure 6B:
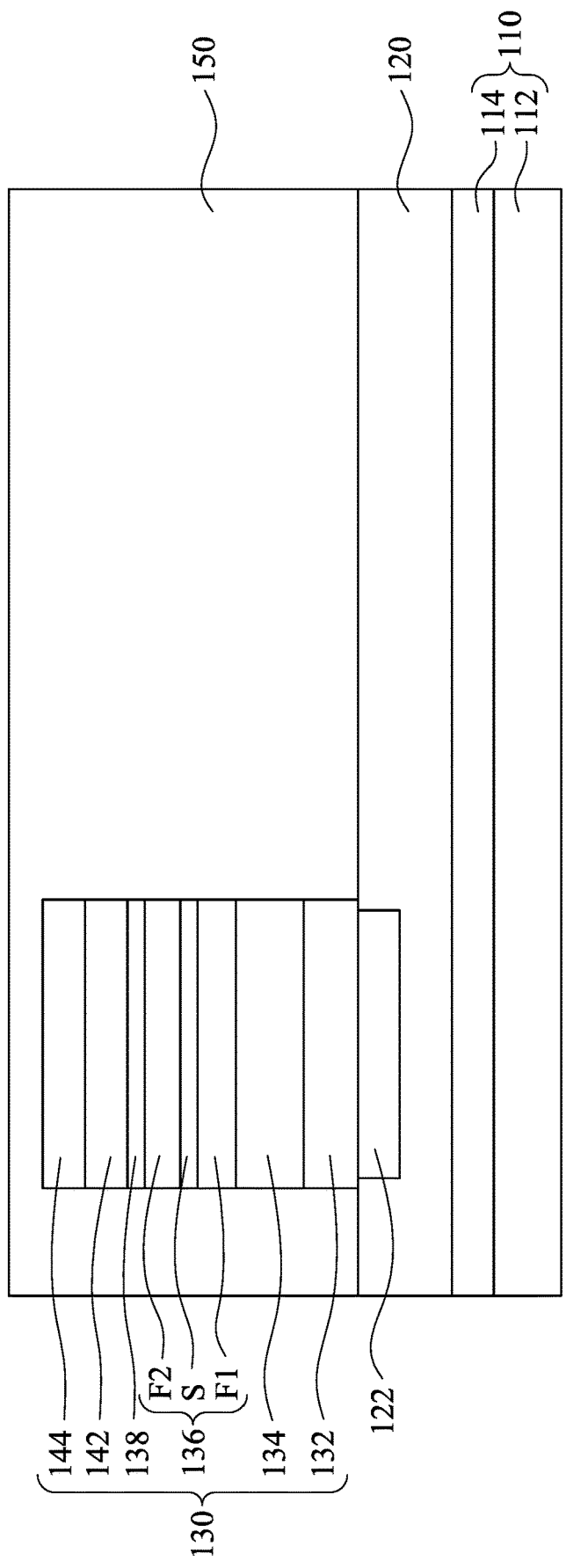

In operation S18 of method M10 in FIG. 2A, a first dielectric layer 150 is formed over the IMD layer 120 and covers the memory stack 130, as shown in FIGS. 6A and 6B. The first dielectric layer 150 may include, for example, silicon oxide, silicon nitride, low-k silicon oxide such as a porous silicon oxide layer, other suitable dielectric material, combinations thereof, or the like.

Figure 7A:
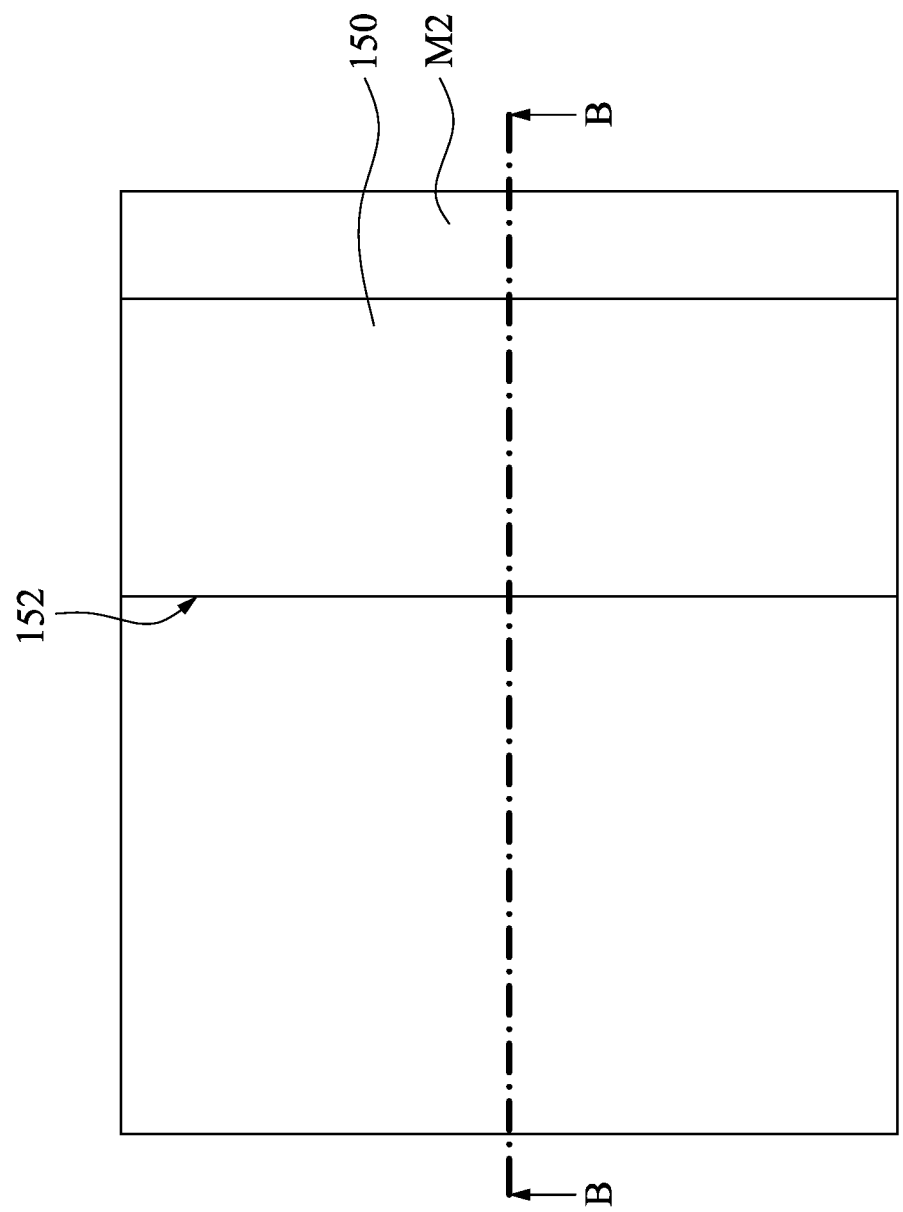
Figure 7B:
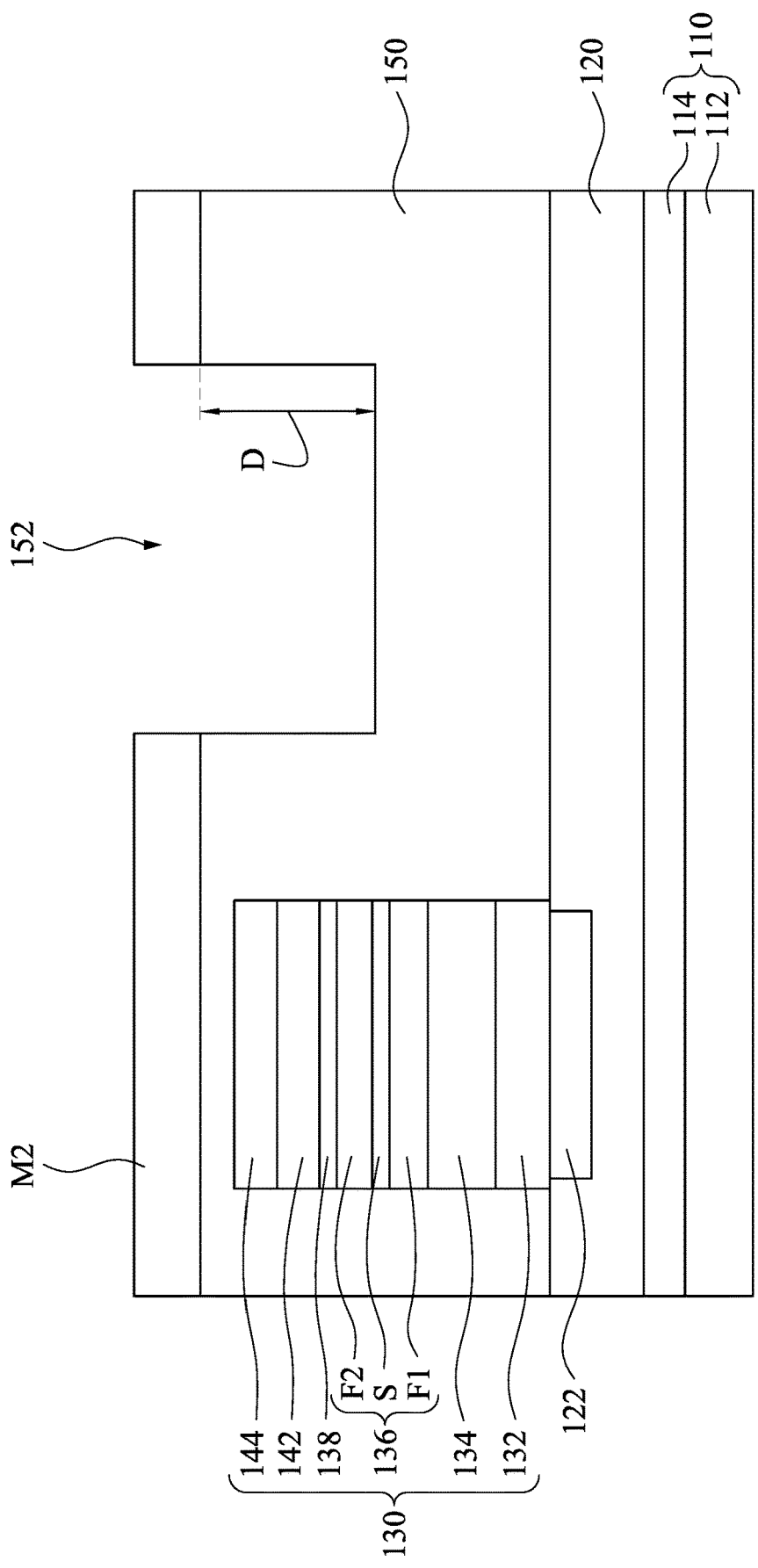

In operation S20 of method M10 in FIG. 2A, a first opening 152 is formed in the first dielectric layer 150 and spaced apart from the memory stack 130, as shown in FIGS. 7A and 7B. For example, another patterned mask layer M2 is formed over the first dielectric layer 150, such that the patterned mask layer M2 exposes a portion of the first dielectric layer 150. In some embodiments, a mask material may be formed over the first dielectric layer 150 by using spin-coating or other suitable techniques, and the mask material is patterned to be the patterned mask layer M2. The patterning process may be an etching process by using etching gases such as Ar, $CF_4$, $SF_6$, halogen gases, or other suitable gases. The patterned mask layer M2 has at least one first opening 152 which exposes the first dielectric layer 150. Then, the first dielectric layer 150 is patterned (etched) using the patterned mask layer M2 as a mask to form the opening 152 in the first dielectric layer 150. The opening 152 is a blind hole, which means that the opening 152 does not extend to the IMD layer 120. The opening 152 has a depth D smaller than a thickness of the first dielectric layer 150. A top view of the opening 152 may have a suitable shape, such as elliptical, rectangular, or some other shapes with or without rounded corners.

Figure 8A:
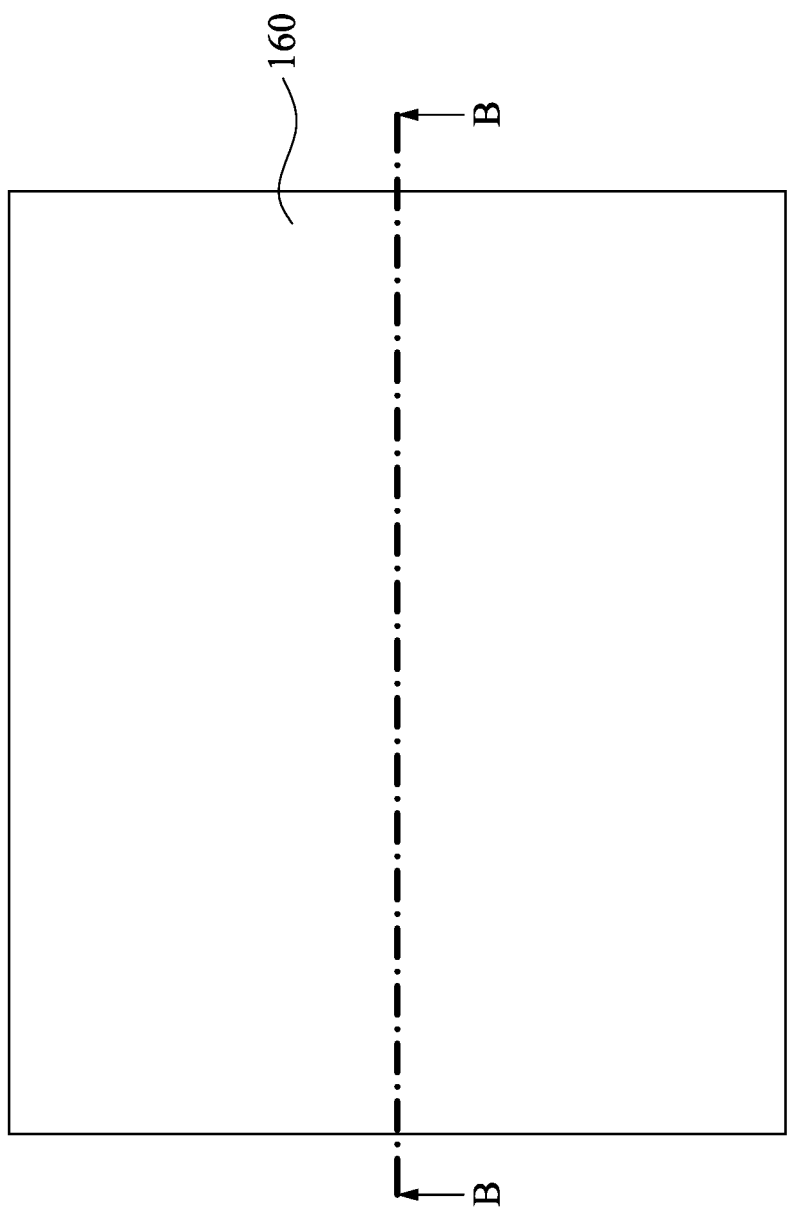
Figure 8B:
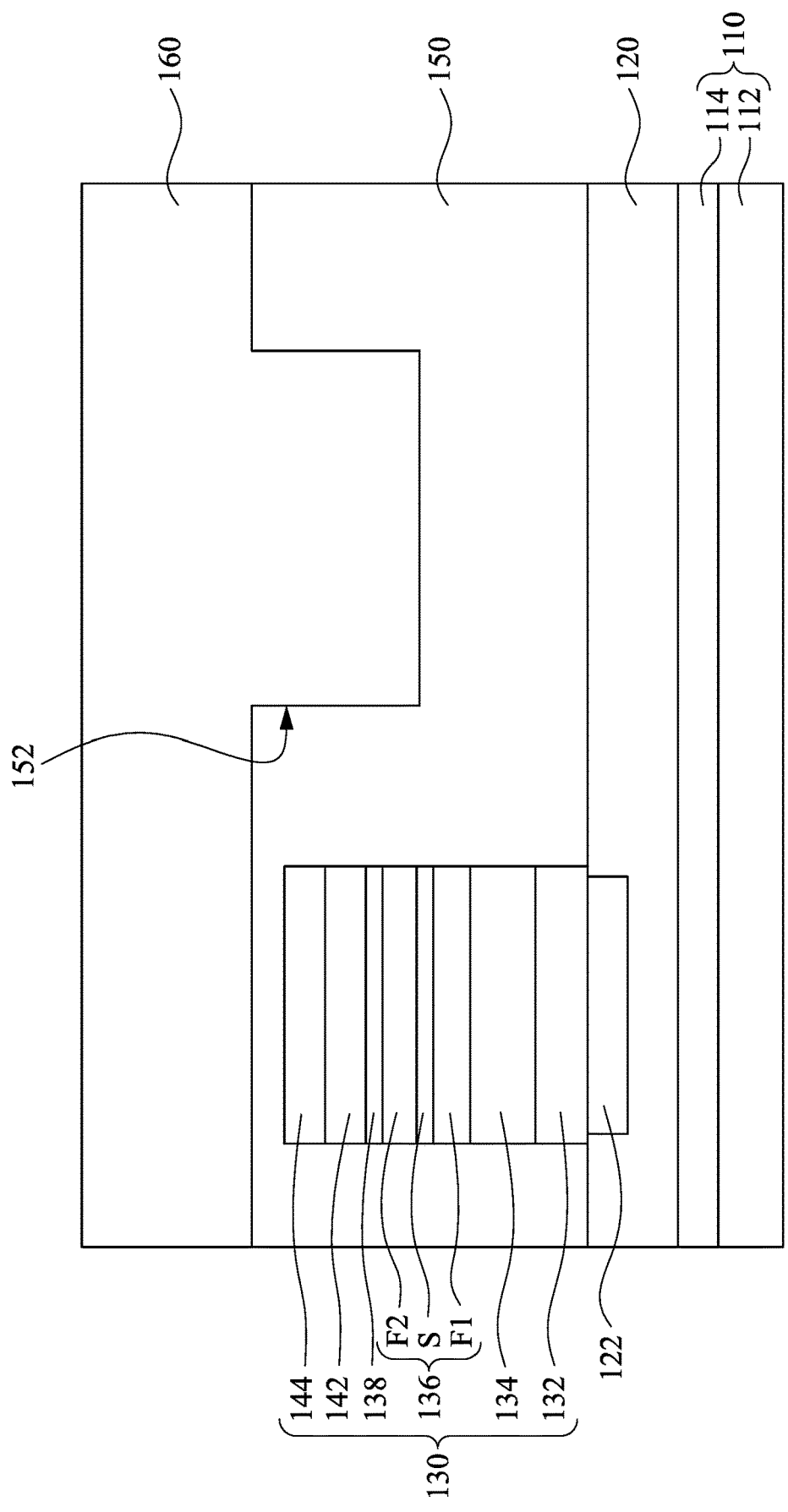

In operation S22 of method M10 in FIG. 2A, a spin-orbit-torque (SOT) material 160 is formed in the first opening 152 and over the first dielectric layer 150, as shown in FIGS. 8A and 8B. In some embodiments, the patterned mask layer M2 is removed by using stripping, ashing, or etching process (such as reactive ion etching (RIE), ion beam etching (IBE), wet etching, or combinations thereof). Then, the SOT material 160 is deposited in the first opening 152 and on the dielectric layer 150. The SOT material 160 is a nonmagnetic material and may include W, Ta, Pt, or other suitable types of heavy metals. Other suitable types of materials, which include topological insulators of which Spin Hall angle is large to provide more spin orbit torque, or spin orbit coupling (SOC) materials may also be used as the SOT materials 160. The SOT material 160 may be formed using suitable techniques, such as PVD, CVD, or ALD.

Figure 9A:
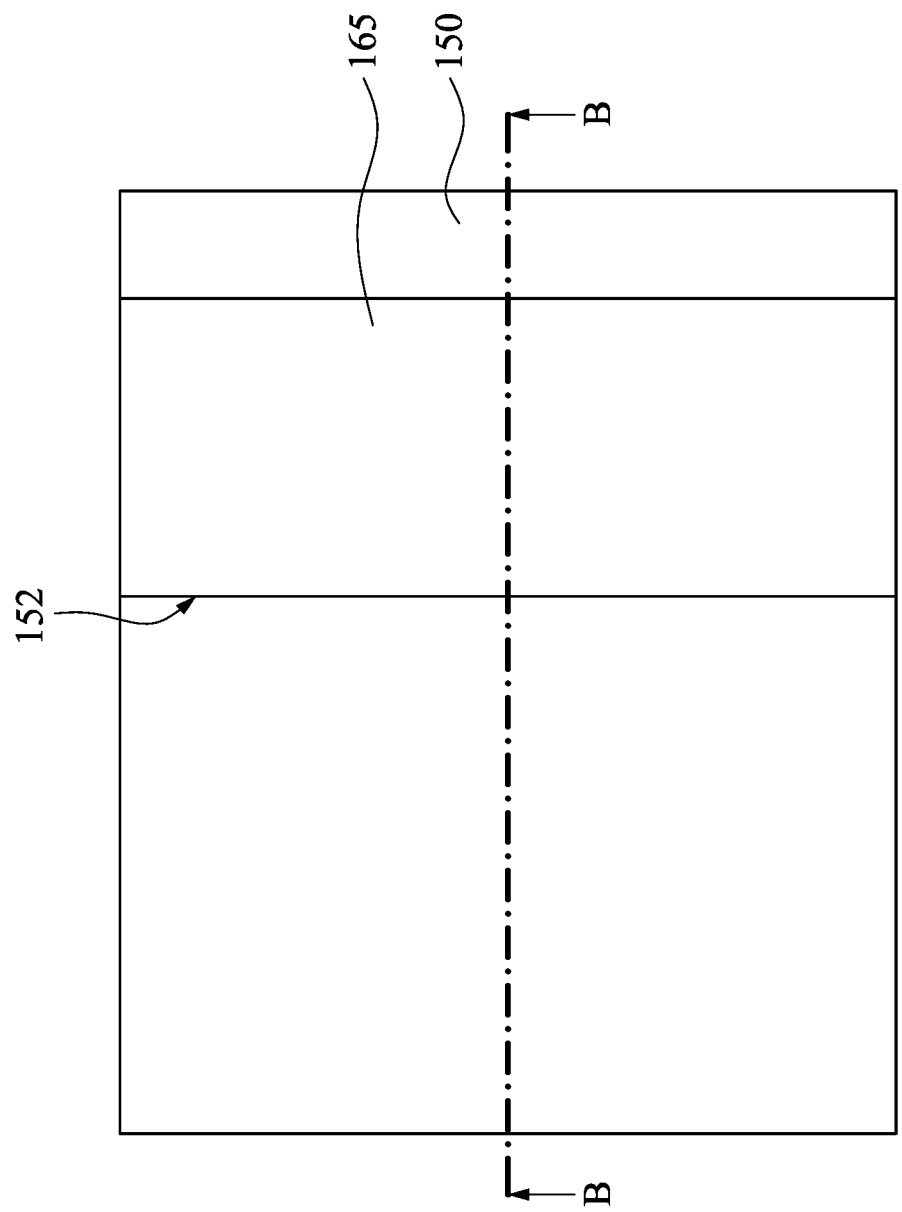
Figure 9B:
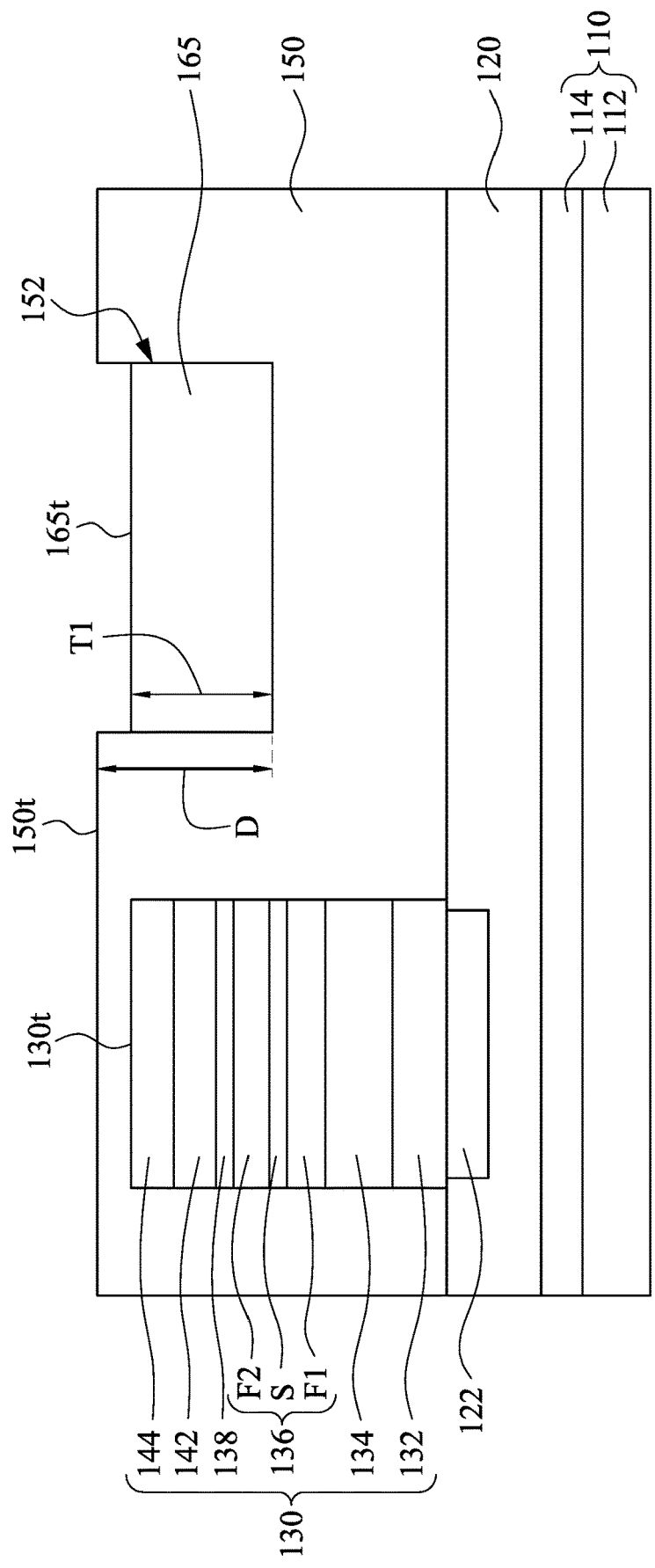

In operation S24 of method M10 in FIG. 2A, the SOT material 160 (see FIGS. 8A and 8B) is patterned to form an SOT layer 165 in the first opening 152, as shown in FIGS. 9A and 9B. For example, the SOT material 160 is patterned by performing a planarization process (such as a CMP process) and then an etching process, such as a reactive ion etching (RIE) process, an ion beam etching (IBE) process, a wet etching process, or combinations thereof. The etching gas may include Ar, $CF_4$, $SF_6$, halogen gases, or other suitable gases. As such, the SOT layer 165 is formed in the first opening 152. A thickness T1 of the SOT layer 165 is less than the depth D of the first opening 152. In FIG. 9B, the top surface 165t of the SOT layer 165 is lower than the top surface 150t of the first dielectric layer 150. In some embodiments, the top surface 165t of the SOT layer 165 and the top surface 130t of the memory stack 130 (i.e., the top surface of the tunnel barrier layer 144') are substantially coplanar. In some embodiments, a thickness T1 of the SOT layer 165 is in a range of about 0.1 nm and about 100 nm. The top view of the SOT layer 165 has substantially the same shape as the opening 152, and may be elliptical, rectangular, or some other shapes with or without rounded corners. The SOT layer 165 and the memory stack 130 are separated by the first dielectric layer 150, which prevent the write current in the SOT layer 165 from leaking to the memory stack 130.

Figure 10A:
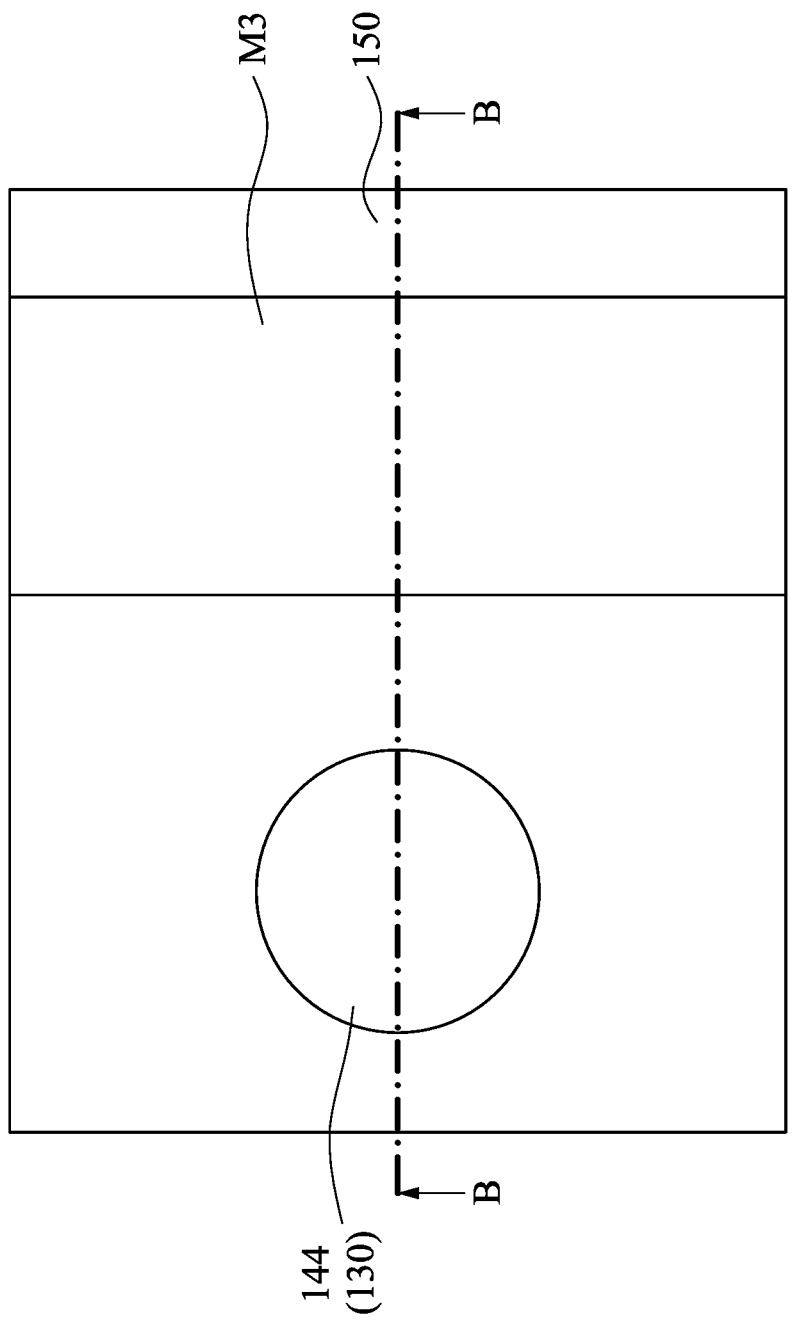
Figure 10B:
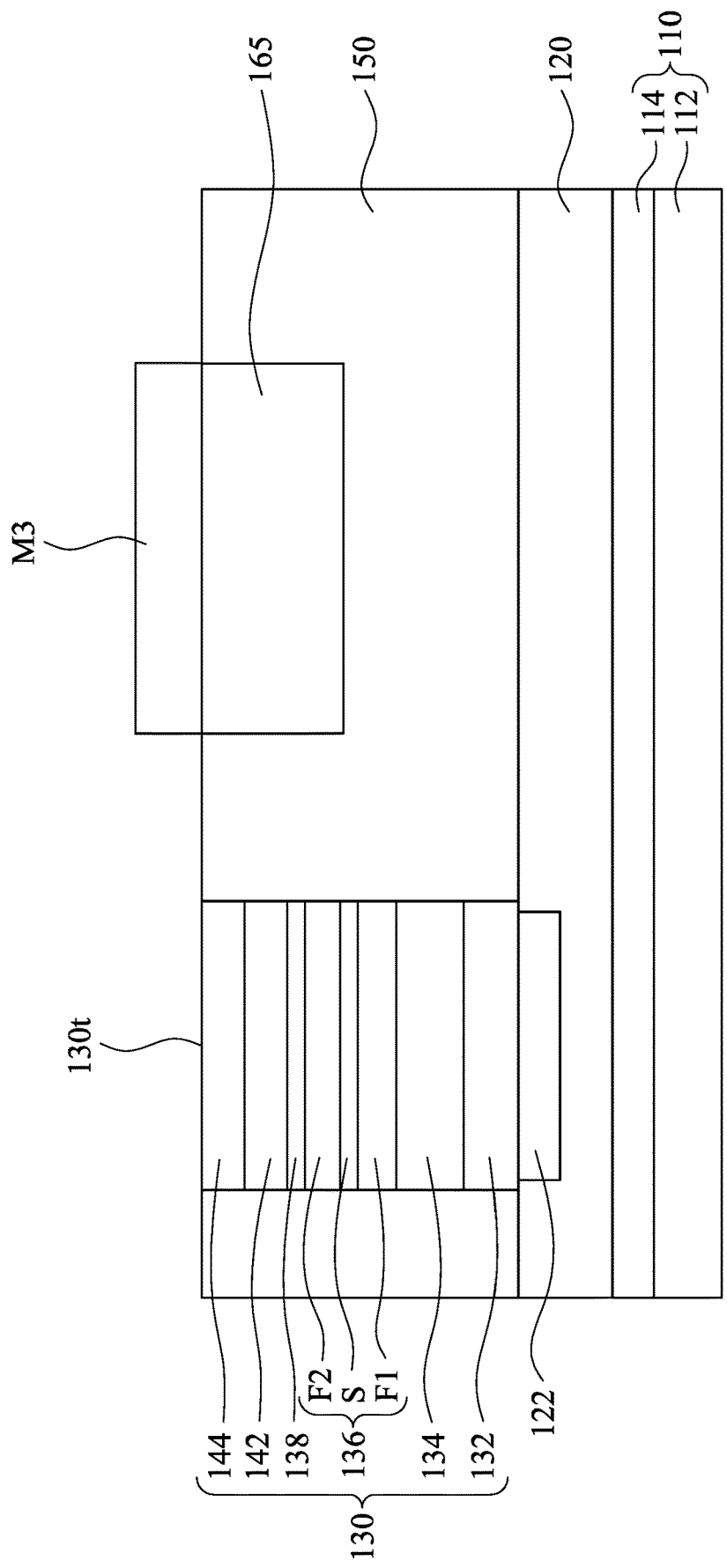

In operation S26 of method M10 in FIG. 2B, the first dielectric layer 150 is etched back to expose the memory stack 130, as shown in FIGS. 10A and 10B. In some embodiments, a patterned mask layer M3 is formed in the first opening 152. For example, a mask material may be formed over the first dielectric layer 150 and in the first opening 152 by using spin-coating or other suitable techniques, and the mask material is patterned to be the patterned mask layer M3. In some embodiments, the patterned mask layer M3 and M1 (see FIGS. 4A and 4B) may have the same or similar material. Then, the first dielectric layer 150 is etched until the top surface 130t of the memory stack 130 is exposed. In some embodiments, the first dielectric layer 150 may be etched by performing a dry etching process, a wet etching process, or combinations thereof.

Figure 11A:
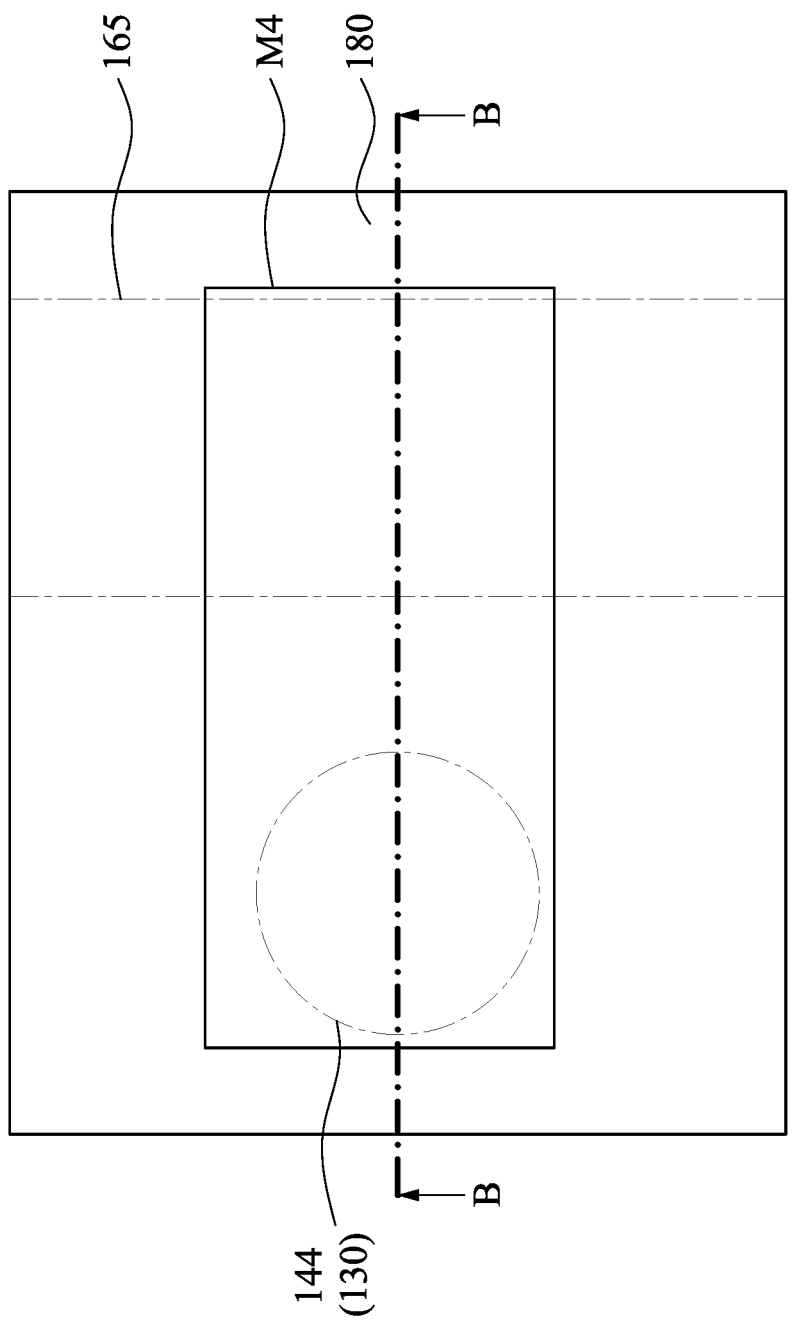

In operation S28 of method M10 in FIG. 2B, a free layer 175 and a capping layer 185 are formed over the memory stack 130 and the SOT layer 165, as shown in FIGS. 11A to 12B. Reference is made to FIGS. 11A and 11B. A ferromagnetic layer 170 is formed over the structure of FIGS. 10A and 10B, i.e., over the memory stack 130 and the SOT layer 165. That is, the ferromagnetic layer 170 is in contact with the tunnel barrier layer 144 of the memory stack 130 and the SOT layer 165. The ferromagnetic layer 170 may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The thickness T2 of the ferromagnetic layer 170 is in a range of about 0.1 nm to about 100 nm. In FIG. 11B, the ferromagnetic layer 170 is a single layer, but in some other embodiments, the ferromagnetic layer 170 may include ferromagnetic film/ spacer/ferromagnetic film trilayer structure.

Then, a capping material 180 is formed over the ferromagnetic layer 170. The capping material 180 may include non-ferromagnetic material, which may be a metal or an insulator, for example, Ta, W, Mo, MgO, or the like. The MgO capping material 180 increases PMA in the free layer 175 (see FIG. 12B), and thus increases the thermal stability factor of its associated MRAM cell. The Ta, W, and/or Mo capping material 180 may remove the impurities in the free layer 175 (such as B in CoFeB), and thus also increases the thermal stability factor of its associated MRAM cell. The ferromagnetic layer 170 and the capping material 180 may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Then, a patterned mask layer M4 is formed over the capping material 180. For example, a mask material is formed over the capping material 180 by using spin-coating or other suitable techniques, and the mask material is patterned to be the patterned mask layer M4. The patterned mask layer M4 and M1 (see FIGS. 4A and 4B) may have the same or similar material. A top view of the patterned mask layer M4 may have a suitable shape, such as elliptical, rectangular, or some other shapes with or without rounded corners.

Figure 11B:
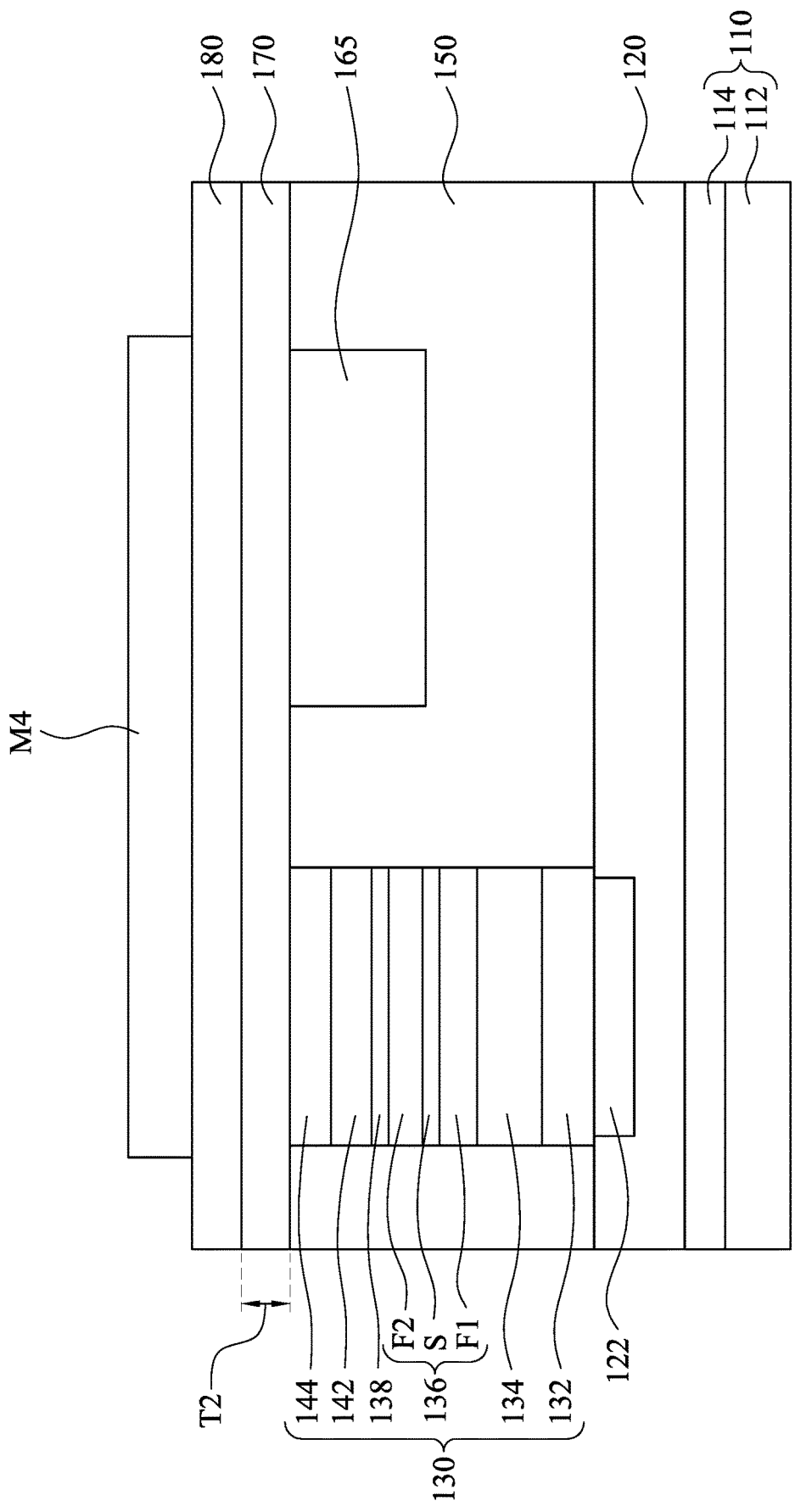
Figure 12A:
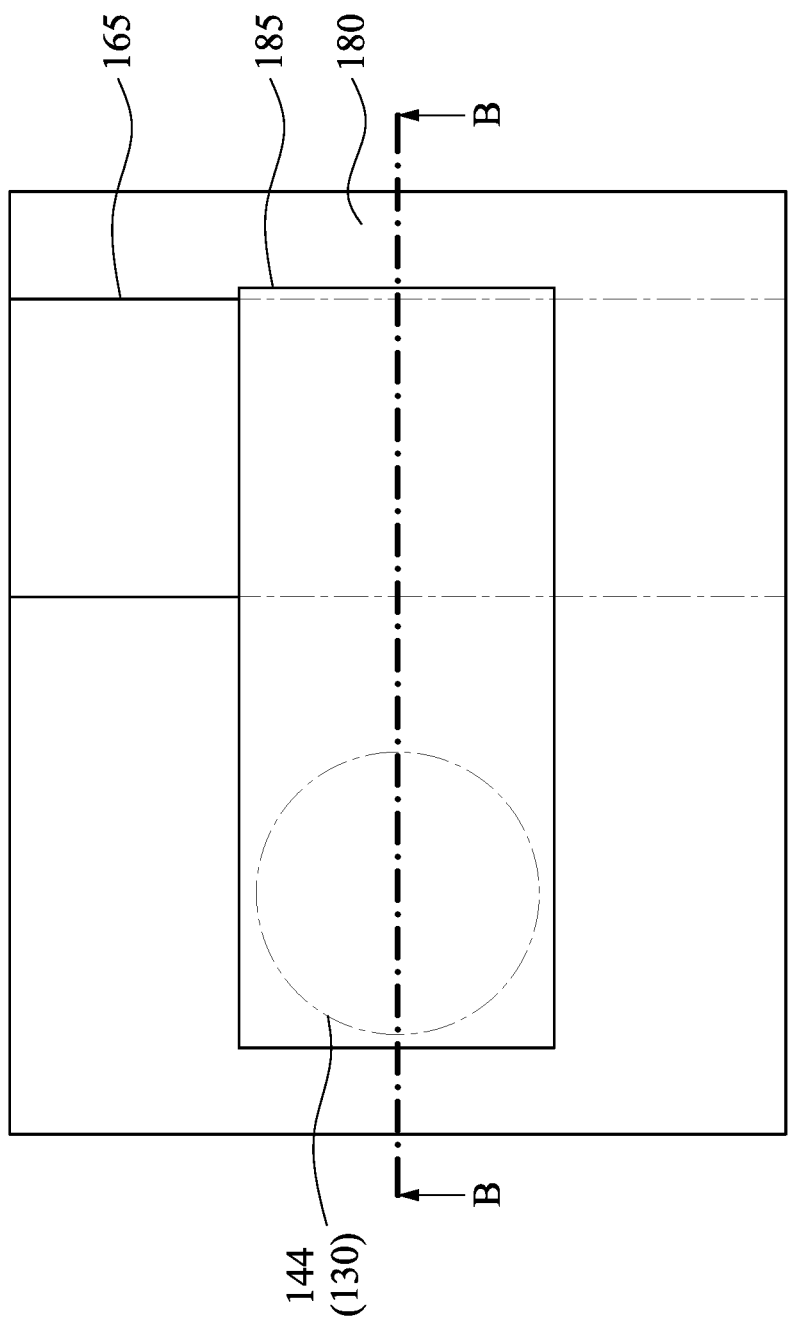
Figure 12B:
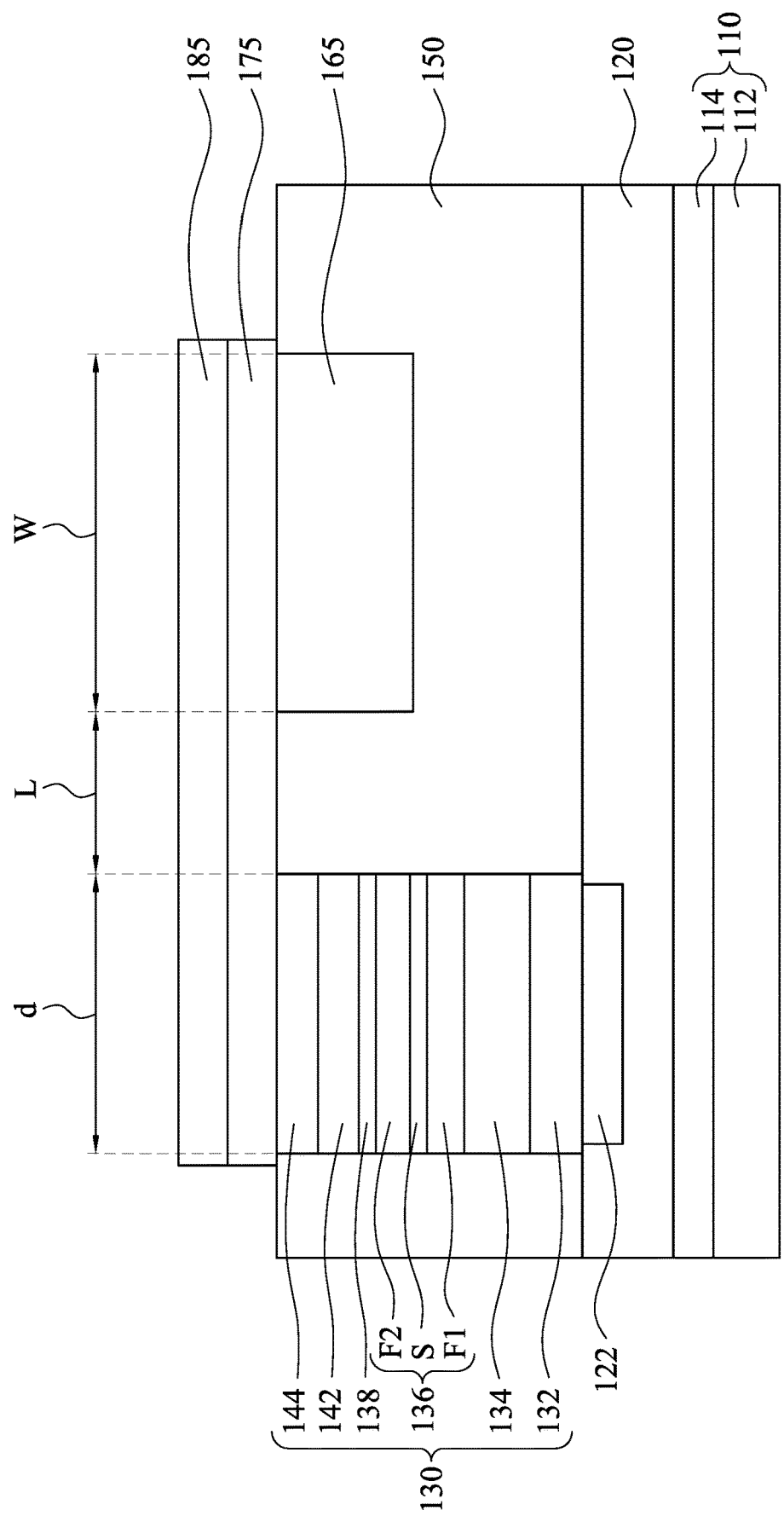

Reference is made of FIGS. 12A and 12B. The capping material 180 and the ferromagnetic layer 170 of FIGS. 11A and 11B are patterned to be the capping layer 185 and the free layer 175 using the patterned mask layer M4 as a mask. As such, the top views of the capping layer 185 and the free layer 175 have substantially the same shape as the patterned mask layer M4, and may be elliptical, rectangular, or some other shapes with or without rounded corners. The free layer 175 is in contact with the memory stack 130 and the SOT layer 165. In other word, the free layer 175 is on the memory stack 130 and the SOT layer 165. In FIG. 11B, the free layer 175 is a single layer, but in some other embodiments, the free layer 175 may include ferromagnetic film/spacer/ferromagnetic film trilayer structure. The capping layer 185 overlaps the memory stack 130 and the SOT layer 165. The capping material 180 and the ferromagnetic layer 170 may be patterned by performing an etching process, such as a dry etching process, a wet etching process, or combinations thereof. The thickness T2 of the free layer 175 is in a range of about 0.1 nm to about 100 nm. After the patterning process, the patterned mask layer M4 may be removed by using stripping, ashing, or etching process (such as reactive ion etching (RIE), ion beam etching (IBE), wet etching, or combinations thereof).

In some embodiments, a diameter d (or a width) of the memory stack 130 is in a range from about 1 nm to about 1000 nm, e.g., about 30 nm to about 50 nm. The switching time of the free layer 175 may be decreases as the diameter d decreases. In some embodiments, a width W of the SOT layer 165 is in a range from about 1 nm to about 1000 nm, e.g., about 30 nm. In some embodiments, a distance L between the memory stack 130 and the SOT layer 165 is in a range from about 1 nm to about 1000 nm, e.g., about 10 nm. If the diameter d (the width W, and/or the distance L) is greater than about 1000 nm, the cell size may be increased and add area burden to the device and thus decrease an efficient use of substrate area for higher density devices. If the distance L is less than 1 nm, there may be a current leakage issue between the memory stack 130 and the SOT layer 165.

Figure 13A:
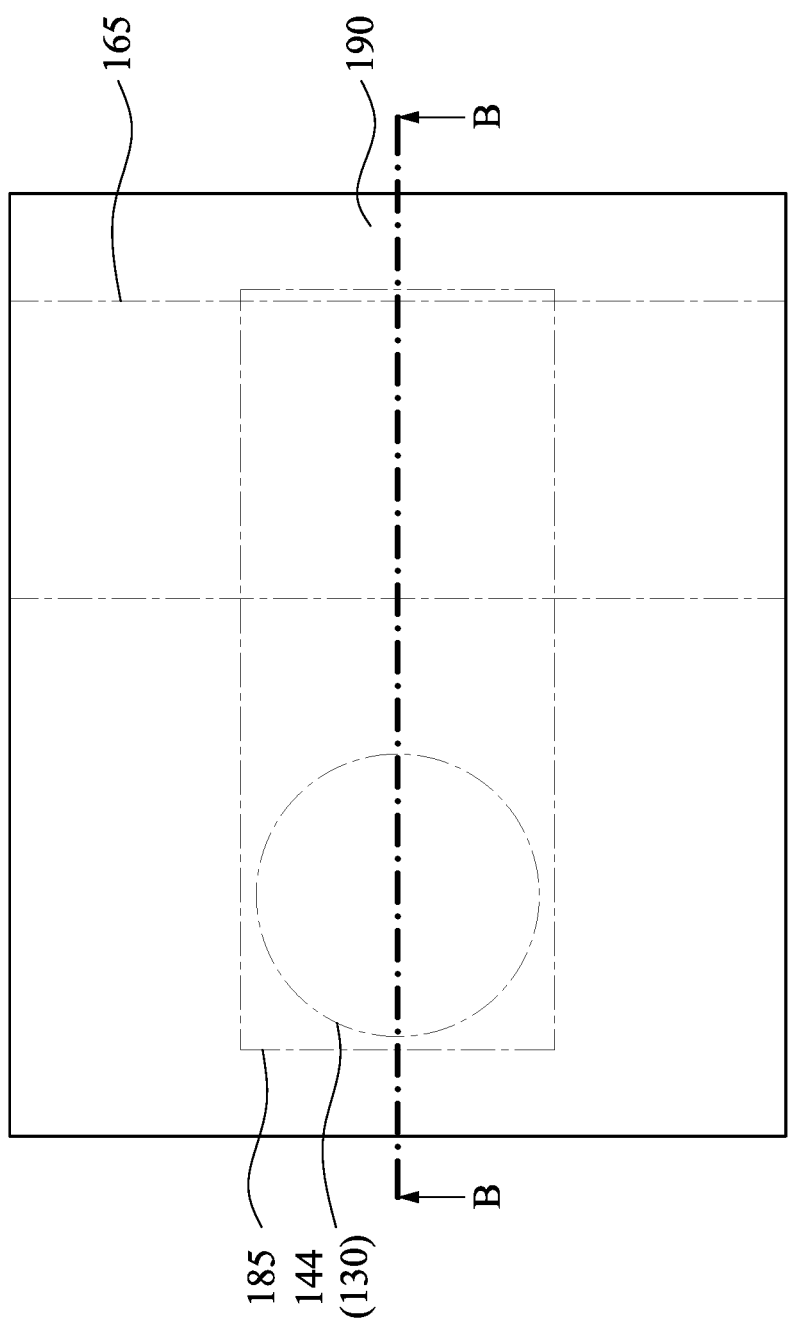
Figure 13B:
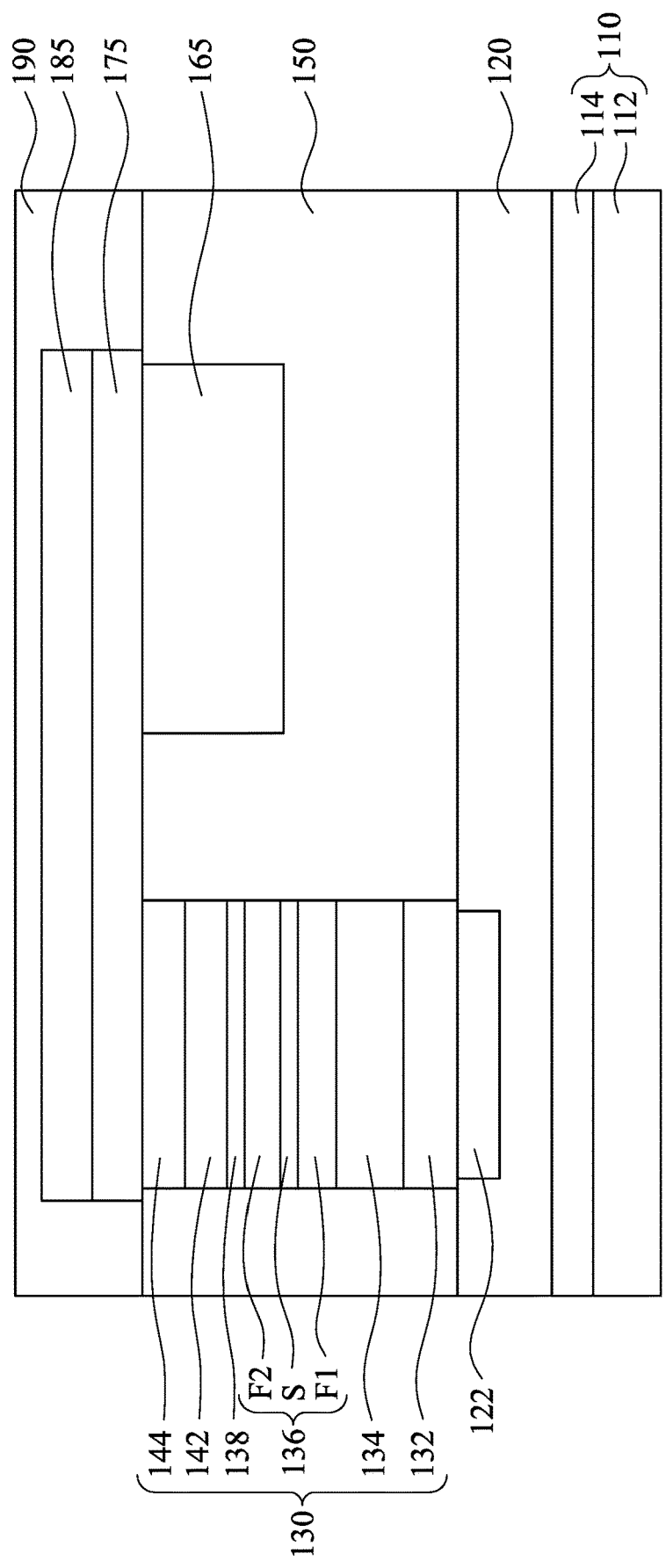

In operation S30 of method M10 in FIG. 2B, a second dielectric layer 190 is formed over the free layer 175, the capping layer 185, and the first dielectric layer 150, as shown in FIGS. 13A and 13B. The second dielectric layer 190 may include, for example, silicon oxide, silicon nitride, low-k silicon oxide such as a porous silicon oxide layer, other suitable dielectric material, combinations thereof, or the like. The second dielectric layer 190 covers the structure of FIGS. 12A and 12B.

Figure 14A:
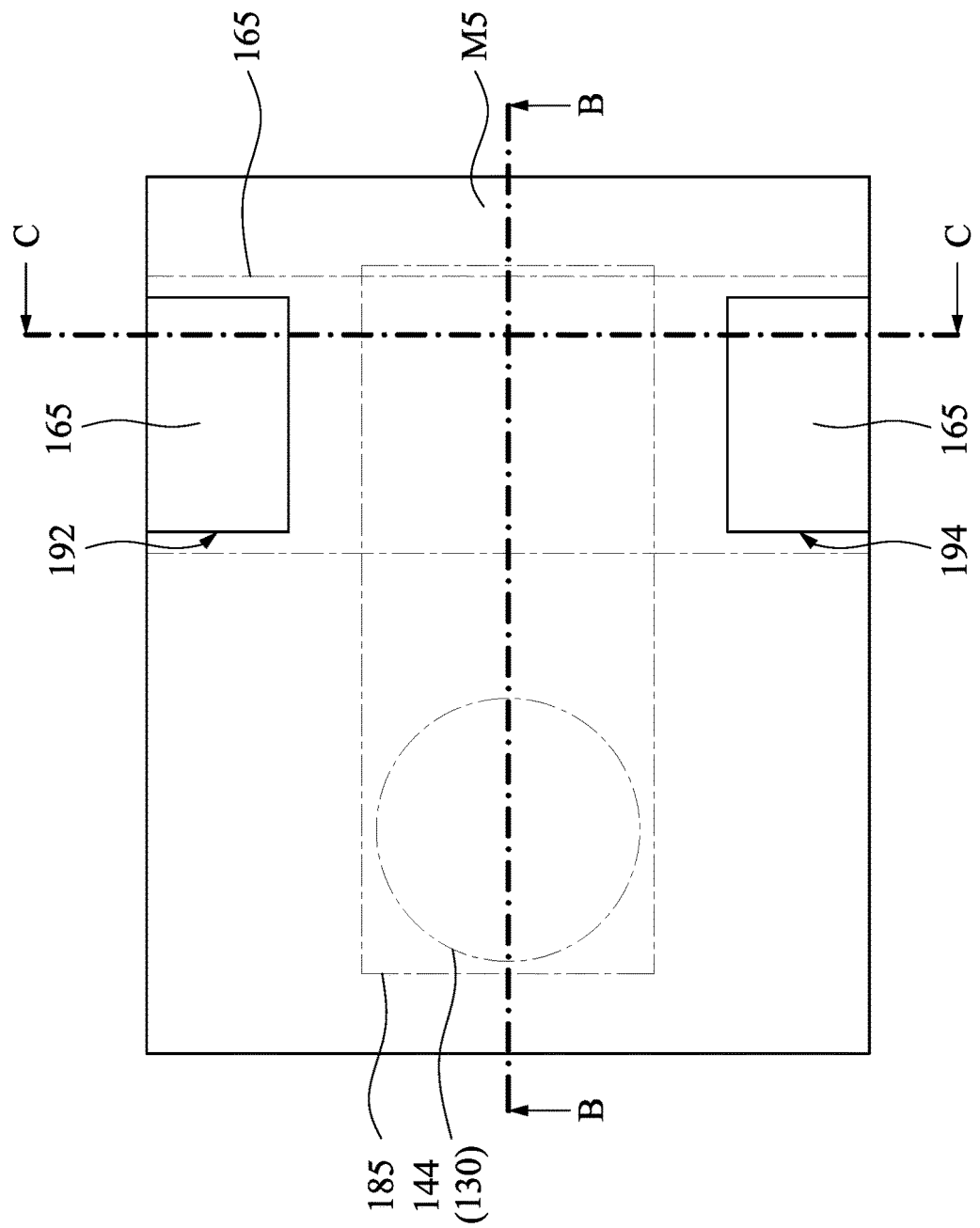
Figure 14B:
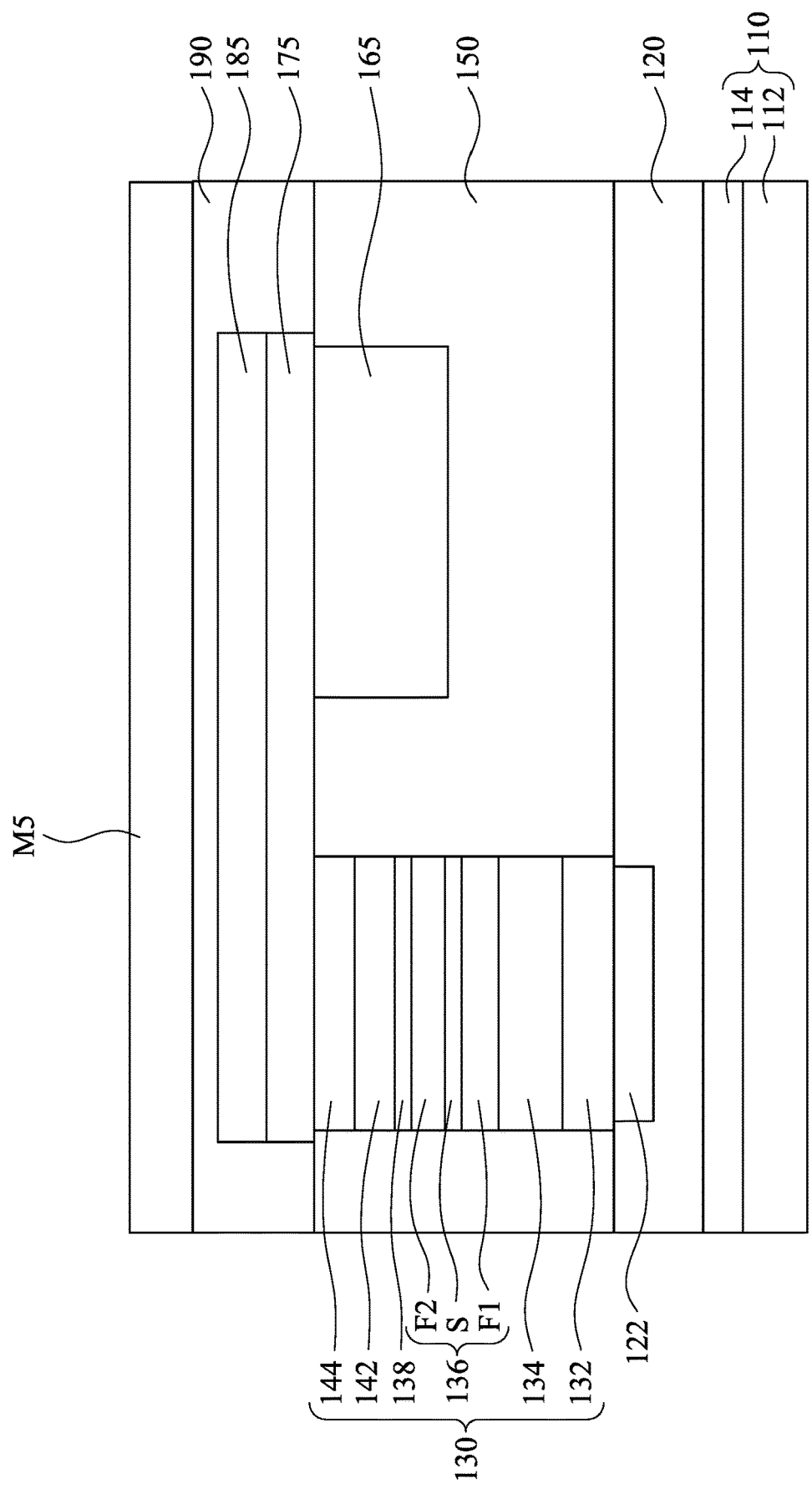
Figure 14C:
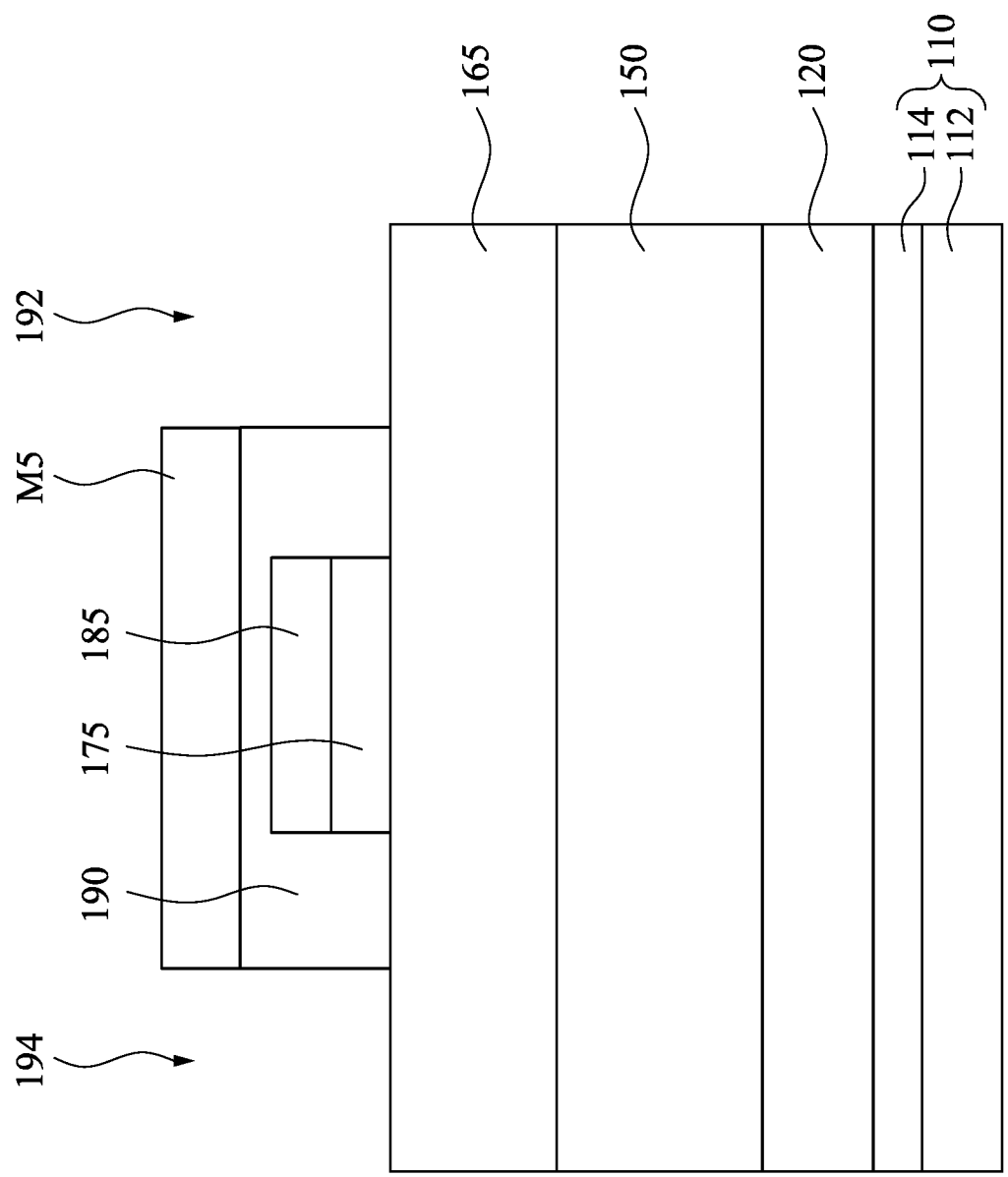
FIGS. 14C, 15C, and 16C illustrate cross-sectional views of lines C-C respectively illustrated in FIGS. 14A, 15A, and 16A.

In operation S32 of method M10 in FIG. 2B, a second electrode 210 and a third electrode 220 are formed in the second dielectric layer 190 and in contact with the SOT layer 165, as shown in FIGS. 14A to 15C. Reference is made to FIGS. 14A, 14B, and 14C. A patterned mask layer M5 is formed over the second dielectric layer 190. For example, a mask material is formed over the second dielectric layer 190 by using spin-coating or other suitable techniques, and the mask material is patterned to be the patterned mask layer M5. The patterned mask layer M5 and M1 (see FIGS. 4A and 4B) may have the same or similar material. The patterned mask layer M5 exposes some portions of the second dielectric layer 190. Then, a second opening 192 and a third opening 194 are formed in the second dielectric layer 190 by using the patterned mask layer M5 as a mask. The second opening 192 and the third opening 194 respectively expose opposite ends of the SOT layer 165.

Figure 15A:
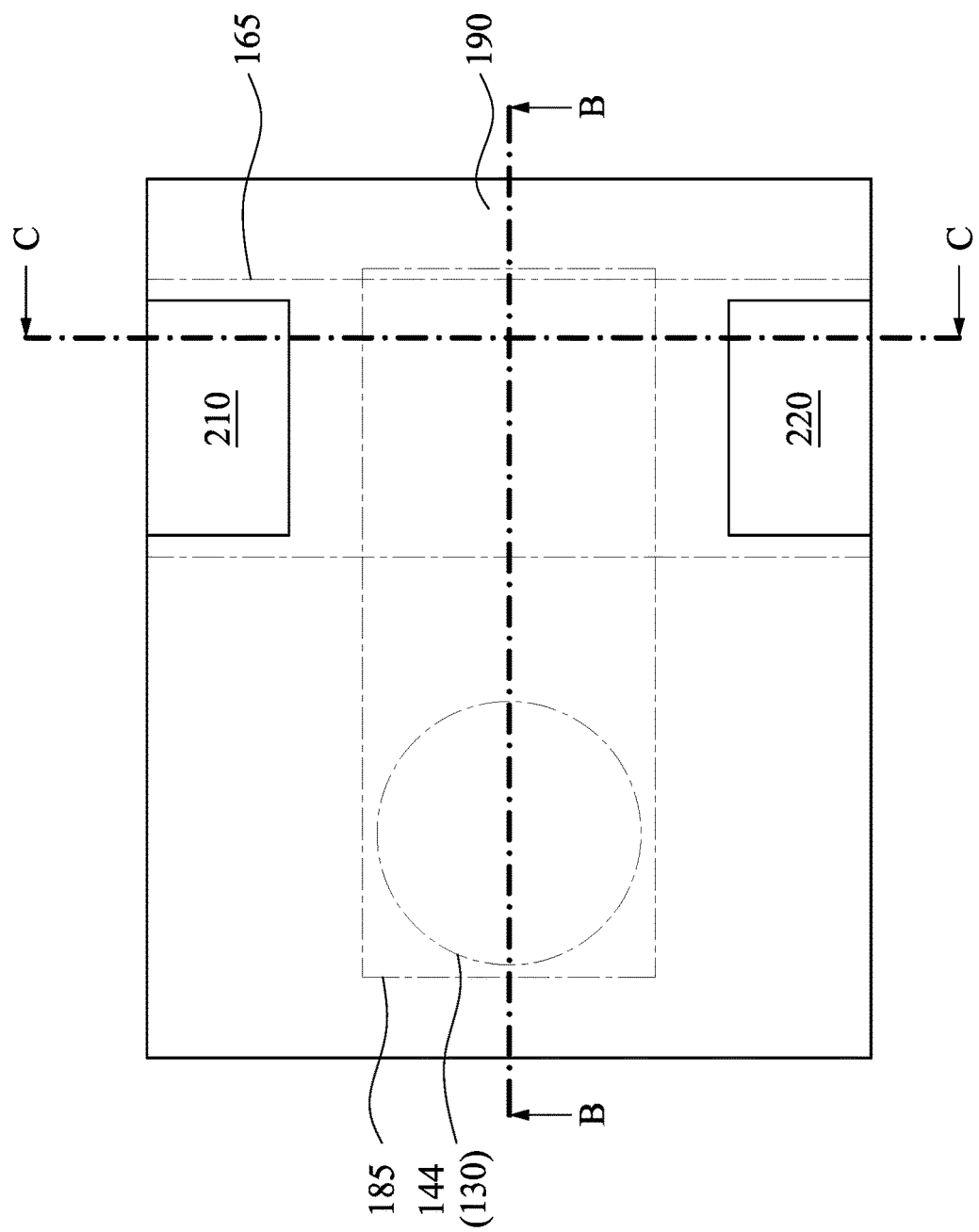
Figure 15B:
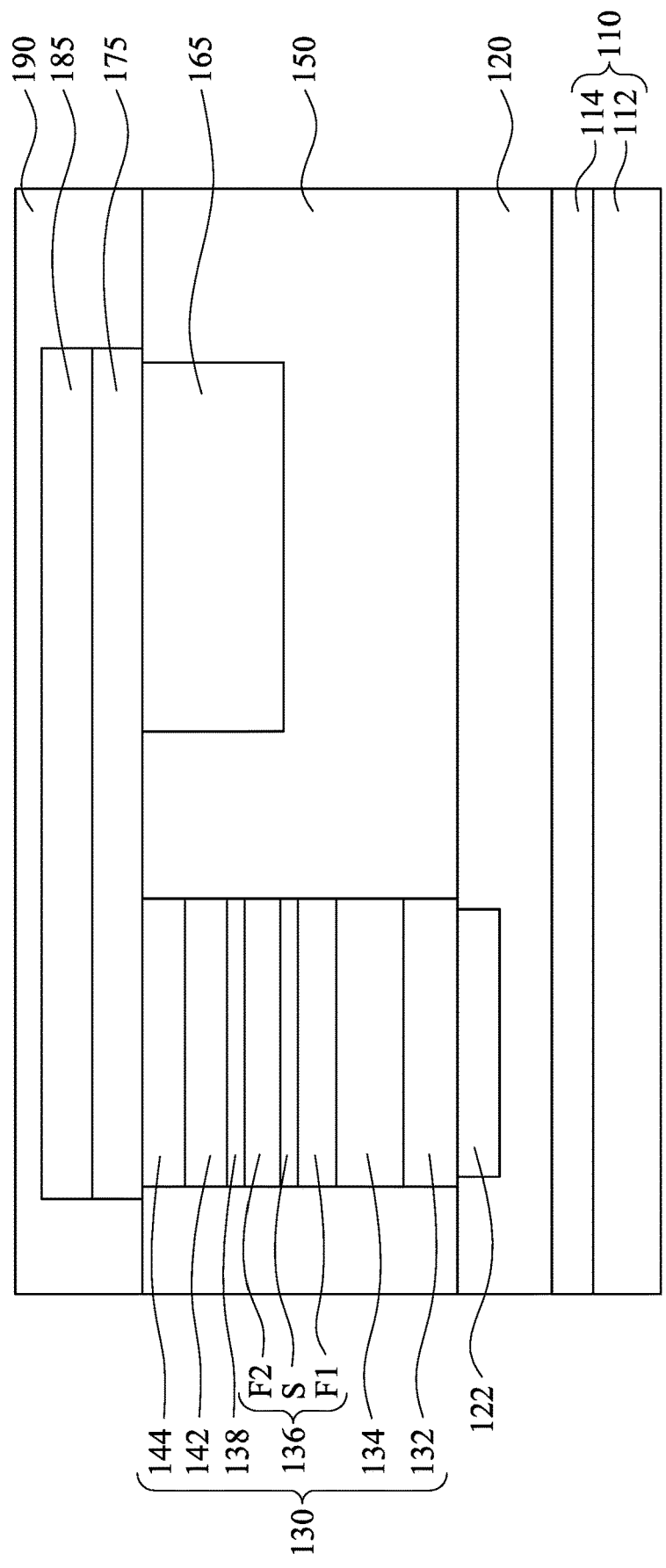
Figure 15C:
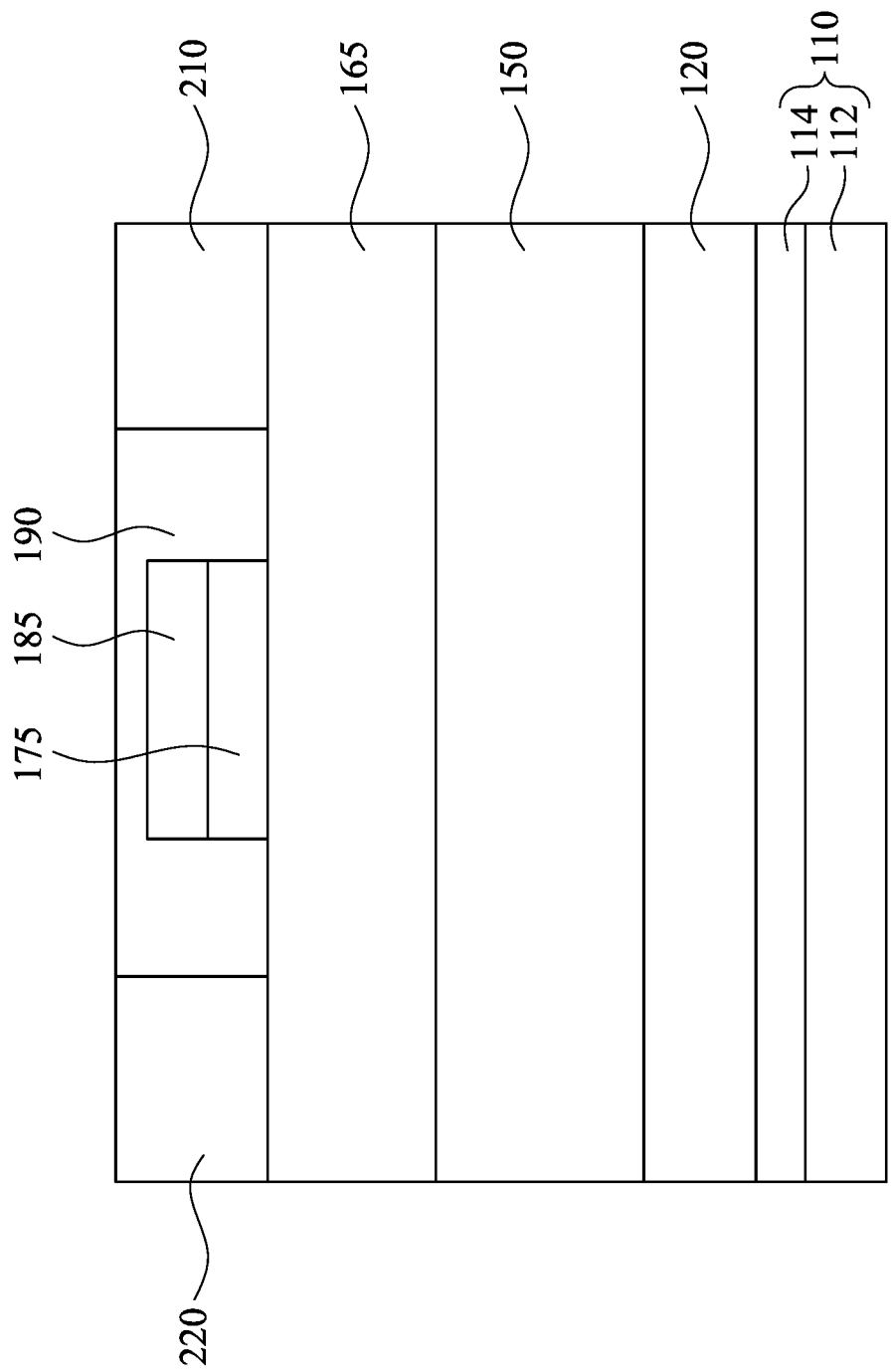

Reference is made to FIGS. 15A, 15B, and 15C. The second electrode 210 and the third electrode 220 are respectively formed in the second opening 192 and the third opening 194. The second electrode 210 and the third electrode 220 may be made of a variety of conductive materials such as metal or metal alloy materials. For example, the second electrode 210 and the third electrode 220 may be made of ruthenium (Ru), copper (Cu), tungsten (W), aluminum (Al), titanium (Ti), tantalum (Ta), TiN, or other suitable conductive material(s) or layered combination thereof. The second electrode 210 and the third electrode 220 may be deposited by a suitable technique, such as physical vapor deposition (PVD), plating or a procedure that includes forming a seed layer by PVD and then plating to form the conductive layer on the seed layer. In some embodiments, the second electrode 210 and the third electrode 220 have a thickness in a range from about 1 nm to about 1000 nm.

Figure 16A:
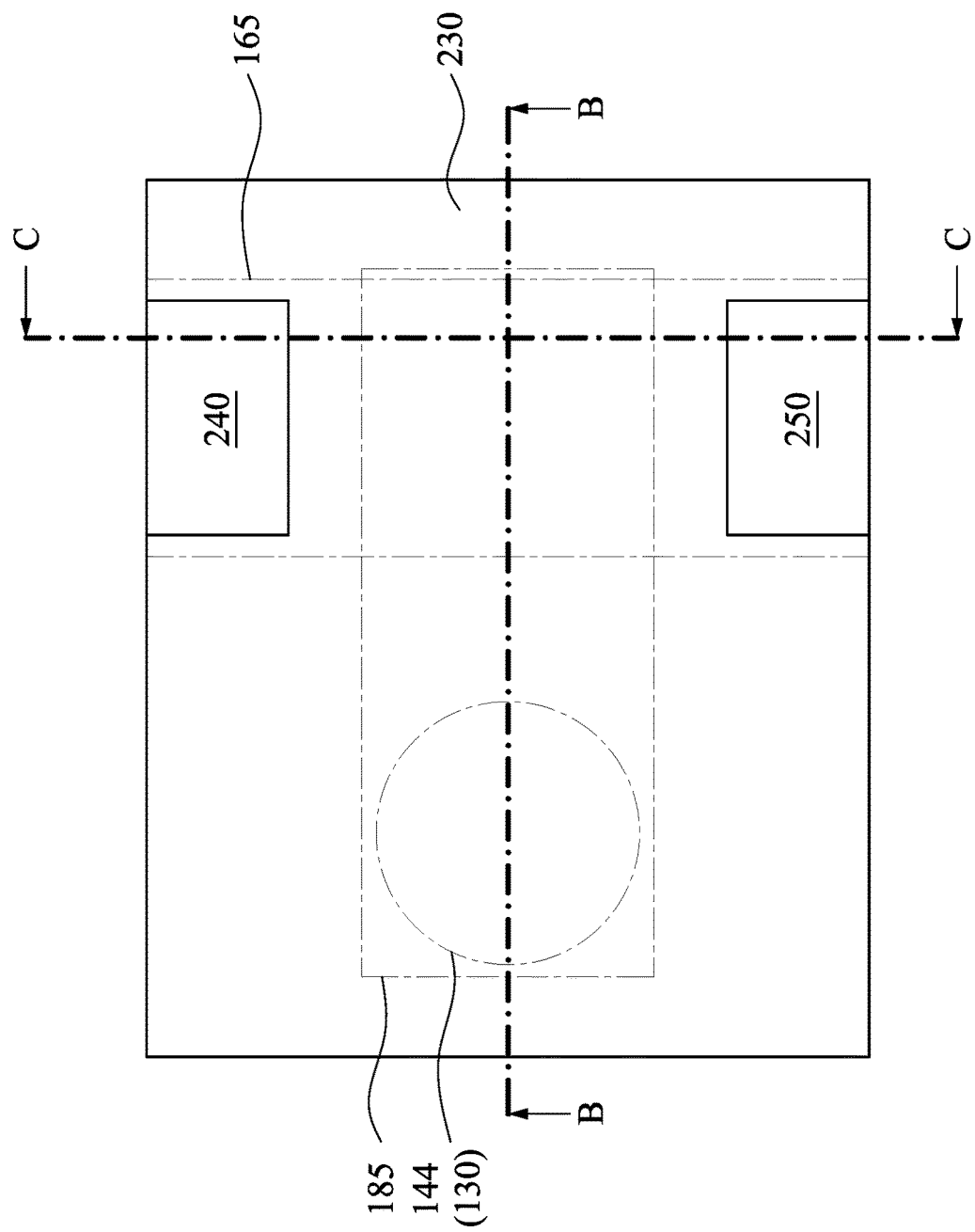
Figure 16B:
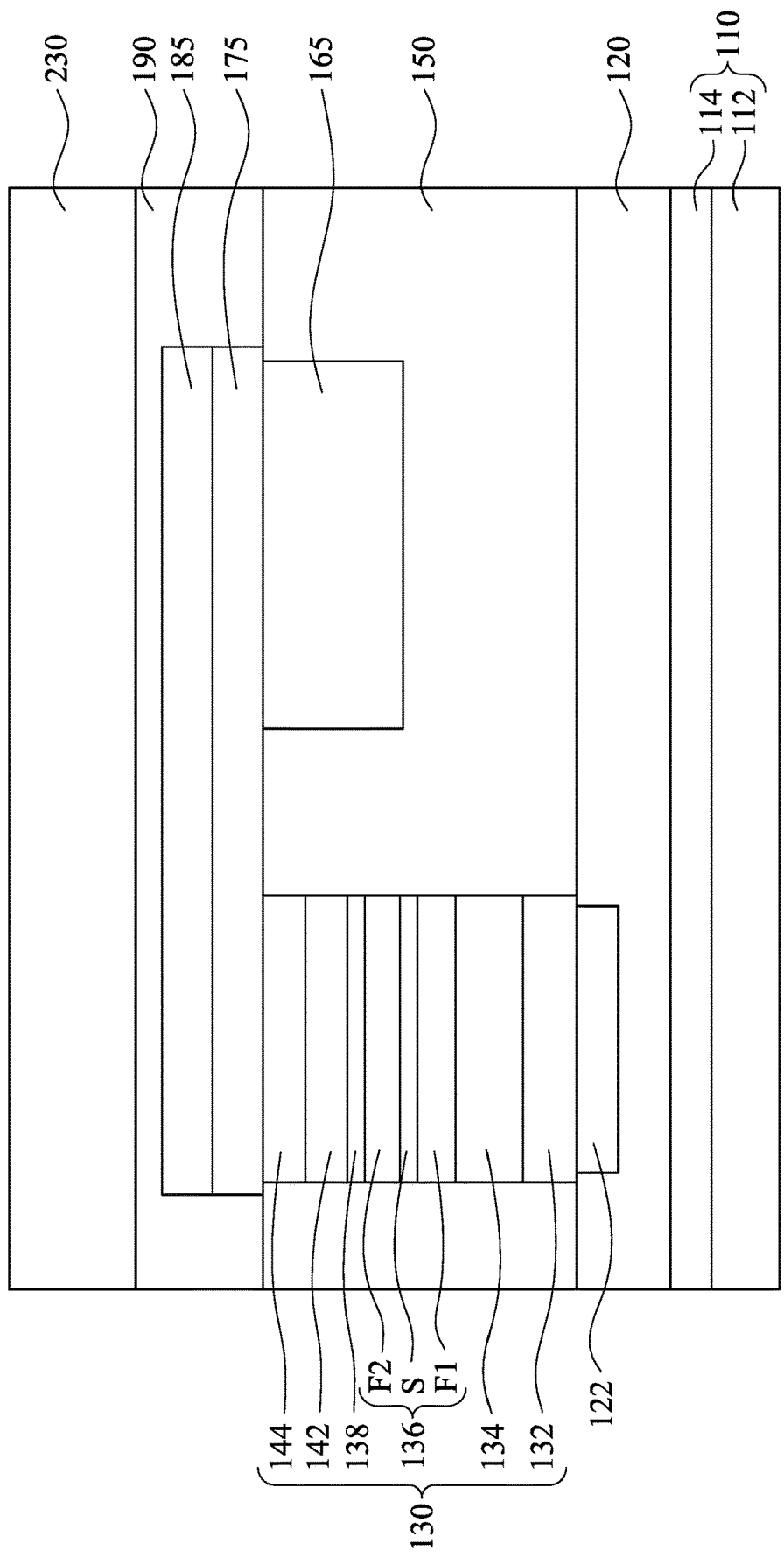
Figure 16C:
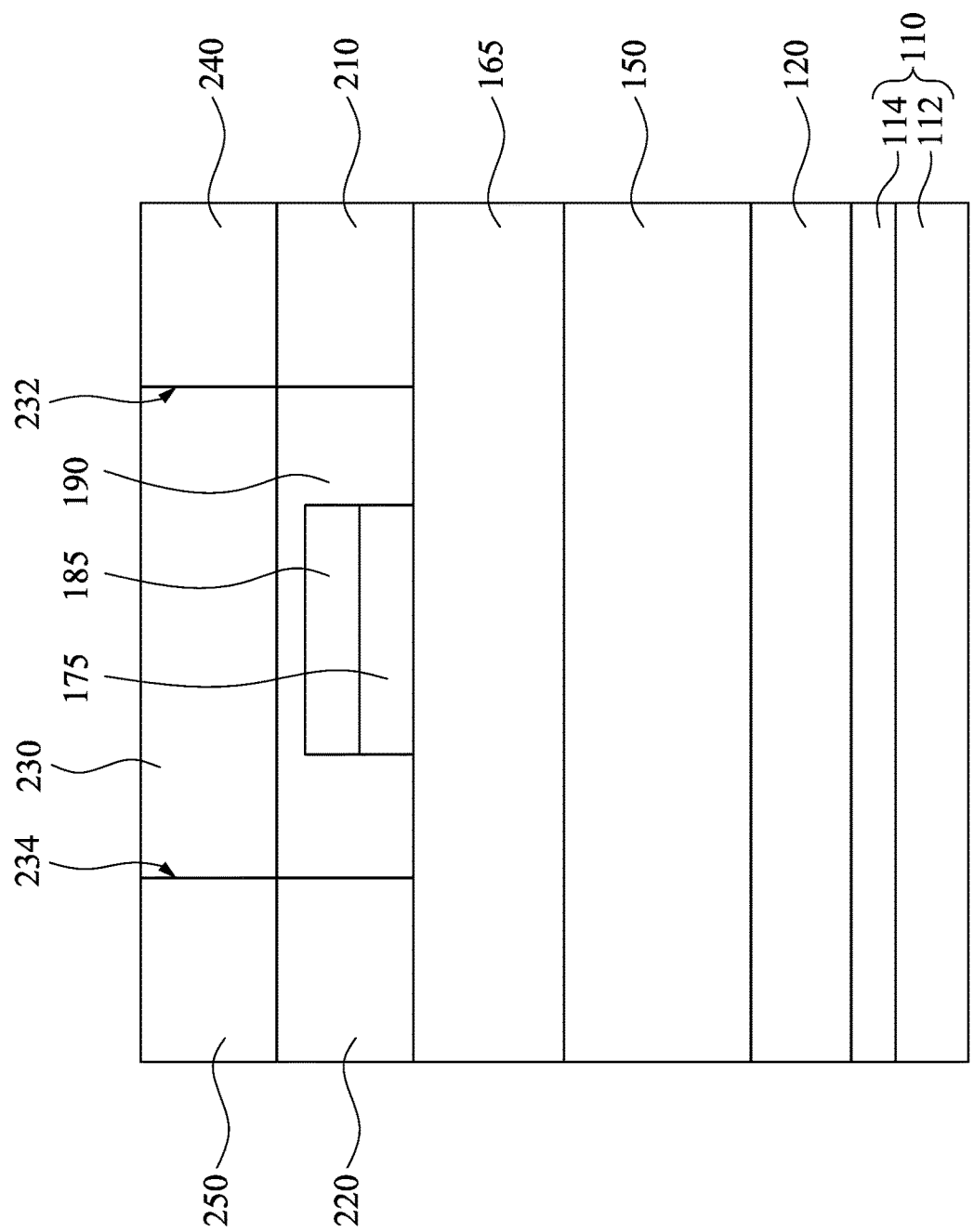

In operation S34 of method M10 in FIG. 2B, a first top via 240 and a second top via 250 are respectively formed on the second electrode 210 and the third electrode 220, as shown in FIGS. 16A, 16B, and 16C. For example, a third dielectric layer 230 is formed over the structure of FIGS. 15A to 15C. The third dielectric layer 230 may include, for example, silicon oxide, silicon nitride, low-k silicon oxide such as a porous silicon oxide layer, other suitable dielectric material, combinations thereof, or the like.

Then, the first top via 240 and the second top via 250 are respectively formed in the third dielectric layer 230. For example, another patterned mask layer (not shown) is formed over the third dielectric layer 230, and a fourth opening 232 and a fifth opening 234 is formed in the third dielectric layer 230 using the patterned mask layer as a mask. The fourth opening 232 and the fifth opening 234 respectively expose the second electrode 210 and the third electrode 220. Then, the first top via 240 and the second top via 250 are respectively formed in the fourth opening 232 and the fifth opening 234. As such, the first top via 240 is in contact with and electrically connected to the second electrode 210, and the second top via 250 is in contact with and electrically connected to the third electrode 220.

In some embodiments, the first top via 240 and the second top via 250 are formed of copper or copper alloys. In some other embodiments, the first top via 240 and the second top via 250 may be formed of conductive materials such as aluminum, tungsten, carbon, cobalt, TaN, or other suitable materials. In still some other embodiments, the first top via 240 and the second top via 250 may individually be a bilayer structure (e.g., a TaN layer and a TiN layer formed on the TaN layer). The first top via 240 and the second top via 250 have a thickness in a range from about 10 nm to about 1000 nm.

Figure 17:
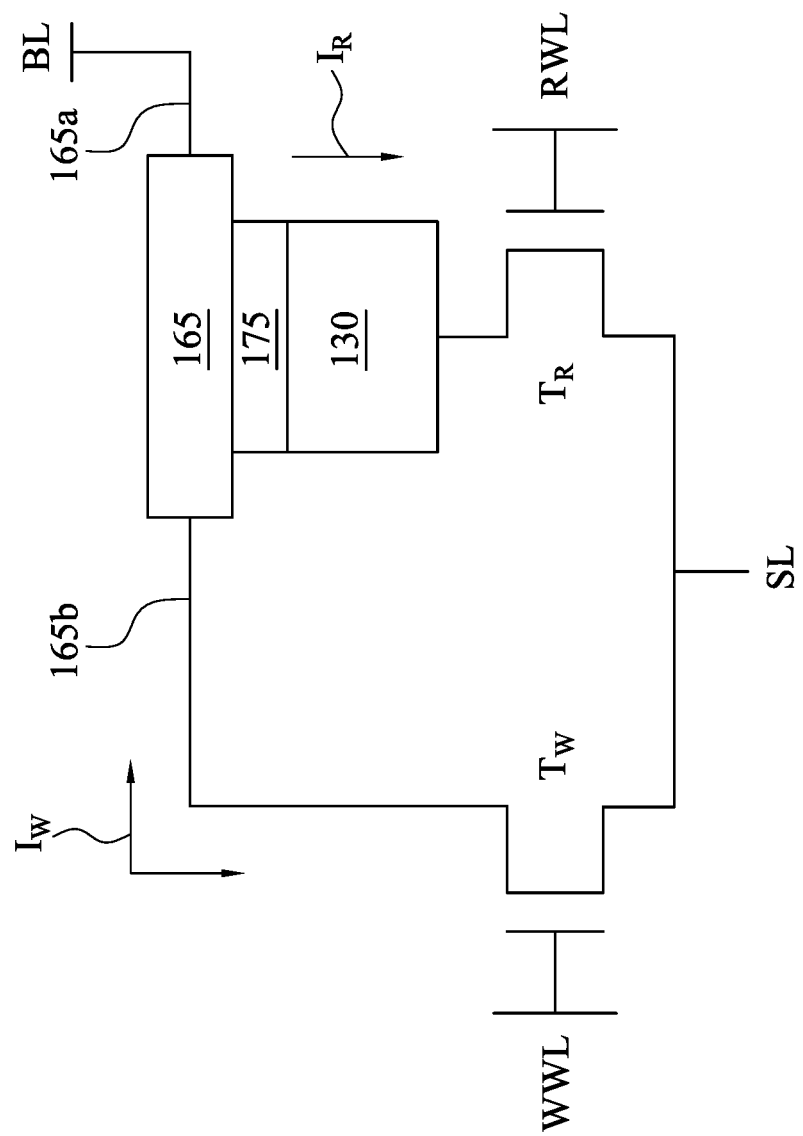
FIG. 17 is a circuit diagram of a memory device according to some embodiments of the present disclosure.

FIG. 17 is a circuit diagram of a memory device according to some embodiments of the present disclosure. The memory device in FIG. 17 is an SOT-MRAM that includes at least one memory cell (e.g., the memory cell over the IMD layer 120 of FIG. 1). The memory device includes a SOT layer 165, a free layer 175 in contact with the SOT layer 165, a memory stack 130, a write transistor $T_W$, and a read transistor $T_R$. The memory stack 130 and the free layer 175 form an MTJ stack, and the memory stack 130 may be shown as FIG. 1. The SOT layer 165 includes two terminals 165a and 165b. The terminal 165a of the SOT layer 165 is electrically connected to a bit line BL, and the terminal 165b of the SOT layer 165 is electrically connected to a terminal of the drain of the write transistor $T_W$. Here, "electrically connected" means that the terminal and the bit line/the drain may be connected directly to each other, and some other conductor may exist between the terminal and the bit line/the drain.

The write transistor $T_W$ controls the write current $I_W$ of the memory cell and has one terminal of the drain connected to the terminal 165b of the SOT layer 165, has the other terminal of the source connected to a source line SL, and has the gate (also called the control terminal) connected to a write word line WWL. The write current $I_W$ of the memory cell passes through the SOT layer 165 to switch the free layer 175 by SOT. The read transistor $T_R$ controls the read current $I_R$ of the memory cell and has one terminal of the drain connected to the memory stack 130 (or the first electrode 132 of FIG. 1), has the other terminal of the source connected to the source line SL, and has the gate (also called the control terminal) connected to a read word line RWL.

Figure 18:
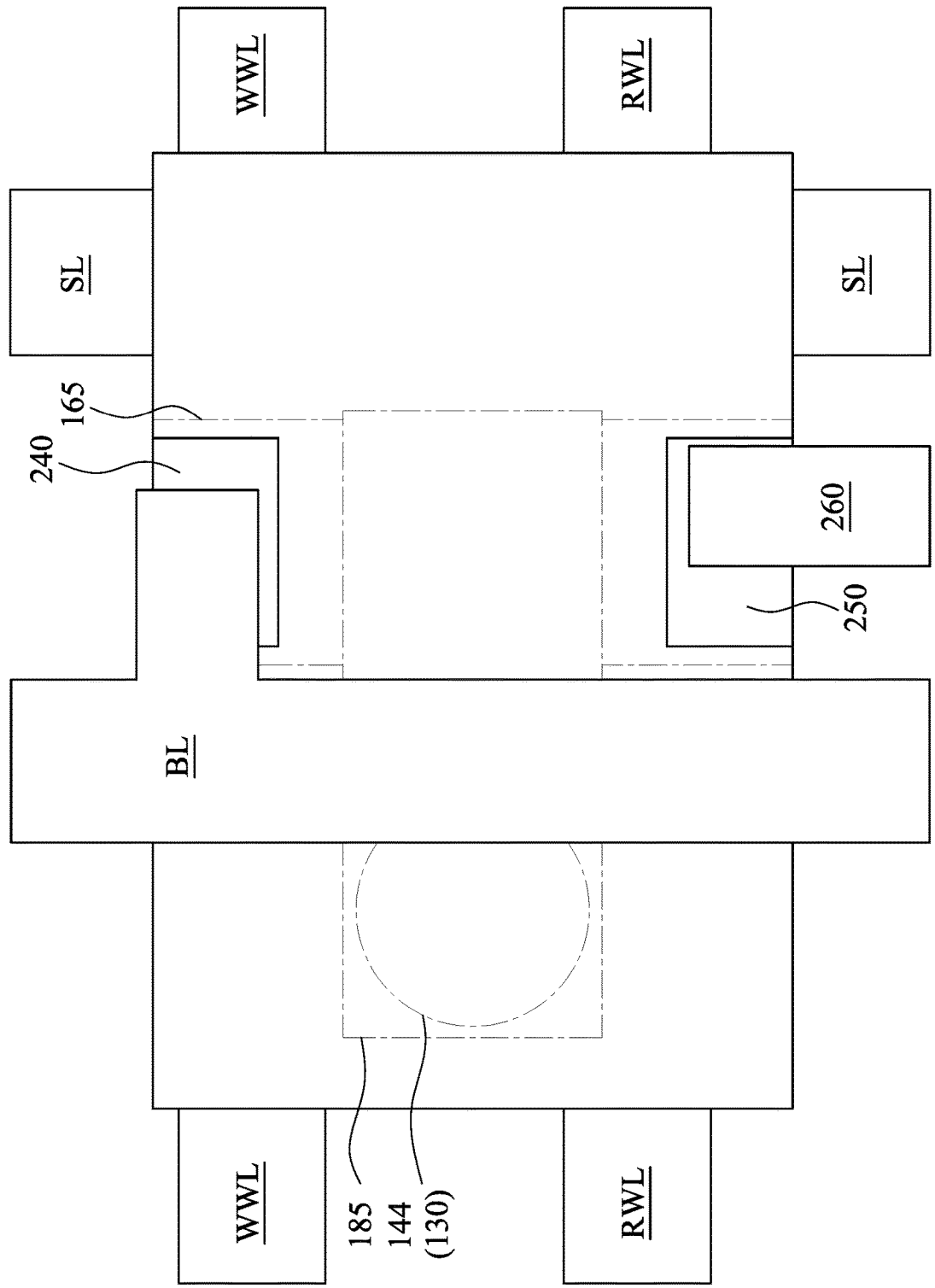
FIG. 18 is a top view of a possible layout of the memory device in FIG. 17 according to some embodiments.

FIG. 18 is a top view of a possible layout of the memory device in FIG. 17 according to some embodiments. Reference is made to FIGS. 17 and 18. In some embodiments, the write transistor $T_W$ and the read transistor $T_R$ are disposed in the logic circuit 114 of FIG. 1. The source line SL may be formed in the IMD layer 120 of FIG. 1 and interconnects the sources of the write transistor $T_W$ and the read transistor $T_R$. The write word line WWL and the read word line RWL may be also formed in the IMD layer 120 but at different level from the source line SL. For example, the write word line WWL and the read word line RWL may be formed above the source line SL, or may be formed under the source line SL. The write word line WWL and the read word line RWL may substantially parallel to each other and may be perpendicular to the source line SL. The memory cell (i.e., the memory stack 130, the SOT layer 165, the free layer 175, and the capping layer 185) is formed over the write word line WWL, the read word line RWL, and the source line SL. The bit line BL is formed above the memory cell and electrically connected to the SOT layer 165. For example, the bit line BL is connected to the first top via 240. An interconnection element 260 is also formed over the memory cell and interconnects the second top via 250 and the drain of the read transistor $T_R$. It is noted that the layout design in FIG. 18 is illustrative and should not limit the present disclosure. The circuit in FIG. 17 may have different layout designs according to different situations.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the pinned layer is in contact with the seed layer, such that the thermal stability of the pinned layer and the MTJ can be improved, and the TMR of MTJ is not degraded after the thermal processes. Another advantage is that since the memory device has a folded configuration, a capping layer may be formed over the free layer to improve the performance of the free layer. For example, the capping layer may increase PMA of the free layer, and/or remove the impurities in the free layer.

According to some embodiments, a magnetoresistive memory device includes a memory stack, a spin-orbit-torque (SOT) layer, and a free layer. The memory stack includes a pinned layer and a reference layer over the pinned layer. The SOT layer is spaced apart from the memory stack. The free layer is over the memory stack and the SOT layer.

According to some embodiments, a magnetoresistive memory device includes a memory stack, a spin-orbit-torque (SOT) layer, a free layer, and a capping layer. The memory stack includes a reference layer and a tunnel barrier layer over the reference layer. The free layer is in contact with the tunnel barrier layer and the SOT layer. The capping layer is over the free layer. The free layer is between the tunnel barrier layer and the capping layer.

According to some embodiments, a method for manufacturing a magnetoresistive memory device includes forming a memory stack. A dielectric layer is formed to cover the memory stack. A spin-orbit-torque (SOT) layer is formed in the dielectric layer and spaced apart from the memory stack. A portion of the dielectric layer is removed to expose the memory stack. A free layer is formed over the memory stack and the SOT layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive memory device comprising:
   a memory stack comprising:
      a pinned layer; and
      a reference layer over the pinned layer;
   a spin-orbit-torque (SOT) layer spaced apart from the memory stack; and
   a free layer over the memory stack and the SOT layer.

2. The magnetoresistive memory device of claim 1, further comprising a capping layer over the free layer.

3. The magnetoresistive memory device of claim 2, wherein perpendicular magnetic anisotropy is formed at an interface of the free layer and the capping layer.

4. The magnetoresistive memory device of claim 2, wherein the capping layer overlaps the SOT layer.

5. The magnetoresistive memory device of claim 1, wherein the free layer and the SOT layer extend toward different directions.

6. The magnetoresistive memory device of claim 1, wherein the memory stack further comprises a first electrode, and the pinned layer and the reference layer are over the first electrode.

7. The magnetoresistive memory device of claim 6, wherein the memory stack further comprises a seed layer between the first electrode and the pinned layer.

8. The magnetoresistive memory device of claim 1, further comprising:
 a second electrode over the SOT layer;
 a first top via over the second electrode;
 a bit line over the SOT layer and connected to the second electrode through the first top via; and
 a third electrode over the SOT layer.

9. The magnetoresistive memory device of claim 8, wherein the second electrode and the third electrode are on opposite sides of the free layer.

10. The magnetoresistive memory device of claim 1, wherein the memory stack further comprises a tunnel barrier layer between the reference layer and the free layer.

11. A magnetoresistive memory device, comprising:
 a memory stack comprising:
  a reference layer; and
  a tunnel barrier layer over the reference layer;
 a spin-orbit-torque (SOT) layer;
 a free layer, wherein a bottom surface of the free layer is in contact with both a top surface of the tunnel barrier layer and a top surface of the SOT layer; and
 a capping layer over the free layer, wherein the free layer is between the tunnel barrier layer and the capping layer.

12. The magnetoresistive memory device of claim 11, wherein the memory stack further comprises a pinned layer, and the reference layer is between the pinned layer and the tunnel barrier layer.

13. The magnetoresistive memory device of claim 11, wherein the tunnel barrier layer and the capping layer are made of the same material.

14. The magnetoresistive memory device of claim 11, further comprising a second electrode and a third electrode in contact with the SOT layer and on opposite sides of the capping layer.

15. The magnetoresistive memory device of claim 14, further comprising:
 a first top via and a second top via respectively over the second electrode and the third electrode; and
 a bit line connected to the first top via.

16. A method for manufacturing a magnetoresistive memory device comprising:
 forming a memory stack;
 forming a dielectric layer covering the memory stack;
 forming a spin-orbit-torque (SOT) layer in the dielectric layer and spaced apart from the memory stack;
 removing a portion of the dielectric layer to expose the memory stack; and
 forming a free layer over the memory stack and the SOT layer.

17. The method of claim 16, further comprising forming a capping layer over the free layer.

18. The method of claim 16, wherein forming the memory stack comprises:
 forming a conductive layer;
 forming a seed layer over the conductive layer;
 forming a pinned layer over the seed layer;
 forming a spacer layer over the pinned layer;
 forming a reference layer over the spacer layer;
 forming a tunnel barrier layer over the reference layer; and
 patterning the tunnel barrier layer, the reference layer, the spacer layer, the pinned layer, the seed layer, and the conductive layer to form the memory stack.

19. The method of claim 16, further comprising forming a first electrode and a second electrode over the SOT layer and on opposite sides of the free layer.

20. The method of claim 19, further comprising:
 forming a first top via and a second top via respectively over the first electrode and the second electrode; and
 forming a bit line over the first electrode and connected to the first top via.

* * * * *